(12) United States Patent
Mizuta et al.

(10) Patent No.: US 9,034,810 B2
(45) Date of Patent: May 19, 2015

(54) PROCESSING AGENT COMPOSITION FOR SEMICONDUCTOR SURFACE AND METHOD FOR PROCESSING SEMICONDUCTOR SURFACE USING SAME

(75) Inventors: Hironori Mizuta, Saitama (JP); Takuhiro Kimura, Saitama (JP)

(73) Assignee: Wako Pure Chemical Industries, Ltd., Osaka-shi (JP)

( * ) Notice: Subject to any disclaimer, the term of this patent is extended or adjusted under 35 U.S.C. 154(b) by 473 days.

(21) Appl. No.: 13/393,981

(22) PCT Filed: Sep. 1, 2010

(86) PCT No.: PCT/JP2010/064904
§ 371 (c)(1),
(2), (4) Date: Mar. 2, 2012

(87) PCT Pub. No.: WO2011/027772
PCT Pub. Date: Mar. 10, 2011

(65) Prior Publication Data
US 2012/0157368 A1    Jun. 21, 2012

(30) Foreign Application Priority Data
Sep. 2, 2009   (JP) ................. 2009-202260

(51) Int. Cl.
C11D 3/60 (2006.01)
G03F 7/42 (2006.01)
H01L 21/311 (2006.01)
C11D 11/00 (2006.01)

(52) U.S. Cl.
CPC ............ G03F 7/425 (2013.01); C11D 11/0047 (2013.01); H01L 21/31133 (2013.01); G03F 7/423 (2013.01); G03F 7/426 (2013.01)

(58) Field of Classification Search
CPC ..... C11D 11/0047; C11D 7/10; C11D 7/3209
USPC ................................ 510/175, 176
See application file for complete search history.

(56) References Cited

U.S. PATENT DOCUMENTS

| | | | |
|---|---|---|---|
| 6,372,410 B1 * | 4/2002 | Ikemoto et al. | 430/318 |
| 6,638,899 B1 * | 10/2003 | Wakiya et al. | 510/176 |
| 2004/0038840 A1 * | 2/2004 | Lee et al. | 510/202 |
| 2004/0106531 A1 * | 6/2004 | Kanno et al. | 510/175 |
| 2005/0054549 A1 * | 3/2005 | Kezuka et al. | 510/407 |
| 2005/0287480 A1 * | 12/2005 | Takashima | 430/331 |
| 2005/0288199 A1 | 12/2005 | Oowada et al. | |
| 2006/0110690 A1 | 5/2006 | Haraguchi et al. | |
| 2006/0138399 A1 | 6/2006 | Itano et al. | |
| 2006/0293208 A1 * | 12/2006 | Egbe et al. | 510/407 |
| 2007/0060490 A1 * | 3/2007 | Skee | 510/175 |
| 2008/0004197 A1 * | 1/2008 | Kneer | 510/245 |
| 2009/0082240 A1 * | 3/2009 | Nukui et al. | 510/176 |
| 2010/0043823 A1 * | 2/2010 | Lee | 134/1.3 |
| 2011/0021400 A1 * | 1/2011 | Mizuta et al. | 510/176 |

FOREIGN PATENT DOCUMENTS

| | | |
|---|---|---|
| JP | 2004-241414 A | 8/2004 |
| JP | 2006-11297 A | 1/2006 |
| JP | 2006-106616 A | 4/2006 |
| WO | 2004/019134 A1 | 3/2004 |
| WO | 2007/058286 A1 | 5/2007 |
| WO | 2009/110582 A1 | 9/2009 |

OTHER PUBLICATIONS

International Search Report of PCT/JP2010/064904, mailing date of Nov. 30, 2010.

* cited by examiner

*Primary Examiner* — Gregory Webb
(74) *Attorney, Agent, or Firm* — Westerman, Hattori, Daniels & Adrian, LLP

(57) ABSTRACT

The present invention is directed to provide a semiconductor surface treating agent; composition which is capable of stripping an anti-reflection coating layer, a resist layer, and a cured resist layer in the production process of a semiconductor device and the like easily and in a short time, as well as a method for treating a semiconductor surface, comprising that the composition is used. The present invention relates to a semiconductor surface treating agent; composition, comprising [I] a compound generating a fluorine ion in water, [II] a carbon radical generating agent; , [III] water, [IV] an organic solvent, and [V] at least one kind of compound selected from a group consisting of hydroxylamine and a hydroxylamine derivative represented by the general formula [1], as well as a method for treating the semiconductor surface, comprising that the composition is used:

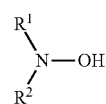

[1]

(wherein $R^1$ represents a linear, branched or cyclic C1-6 alkyl group, or a linear or branched C1-4 substituted alkyl group having 1 to 3 hydroxyl groups; $R^2$ represents a hydrogen atom, a linear, branched or cyclic C1-6 alkyl group, or a linear or branched C1-4 substituted alkyl group having 1 to 3 hydroxyl groups).

27 Claims, No Drawings

PROCESSING AGENT COMPOSITION FOR SEMICONDUCTOR SURFACE AND METHOD FOR PROCESSING SEMICONDUCTOR SURFACE USING SAME

TECHNICAL FIELD

The present invention relates to a semiconductor surface treating agent composition and a method for treating a semiconductor surface using the composition. In more detail, the present invention relates to a semiconductor surface treating agent composition which is capable of stripping an anti-reflection coating layer in a production process for a semiconductor device or the like, and further is capable of stripping not only the anti-reflection coating layer but also a resist layer as a upper layer thereof and a cured resist layer formed in an etching process, and a method for treating a semiconductor surface, comprising that the composition is used.

BACKGROUND OF THE INVENTION

Heretofore, a semiconductor device such as, for example, IC, LSI, has been produced by coating an anti-reflection coating layer to inhibit light scattering in exposure and a resist layer on the upper part of a conductive metal film, an insulation layer and a low dielectric material layer which are formed on a substrate such as silicon wafer by vapor deposition method; subsequently forming a resist pattern by selectively exposing and developing these layers; thereafter forming a fine circuit by etching selectively the conductive metal film, the insulation layer, the low dielectric material layer, the anti-reflection coating layer, and the like using the resist pattern as a mask; further stripping the resist layer and the antireflection coating layer by ashing of the resist layer and the like by ashing, or the like; thereafter treating residues of the resist layer and the anti-reflection coating layer remained in the ashing process and the like with a cleaning (stripping) liquid or the like.

On the other hand, various kinds of resist stripping agents have been known until now (see, for example, Patent Literature 1, Patent Literature 2, and the like). However, there is the following problem. That is, when the above-described substrate after etching is treated using these resist stripping agents, these stripping agents are effective for a substrate where an anti-reflection coating layer has not been coated, while stripping of the anti-reflection coating layer is difficult although stripping of the resist layer is possible for a substrate where an anti-reflection coating layer has been coated. Therefore, it is present situation that simultaneous stripping for both of the resist layer and the anti-reflection coating layer depends solely on a technique such as ashing. However, the technique such as ashing has such problems that a large-scale facility is required, or that since cleaning (stripping) of ashed resist layer residue, anti-reflection coating layer residue and the like remained after the ashing process is necessary in the present situation where ultrafine wiring has been required, the process becomes cumbersome, and so on.

Under such situation, a method for stripping an anti-reflection coating layer by a simple method in which a large-scale facility as mentioned above is not required or the like has been demanded, and existence of a chemical agent to satisfy this requirement or existence of a chemical agent which is capable of stripping not only an anti-reflection coating layer but also a resist layer has been demanded.

PRIOR ART LITERATURES

Patent Literatures

Patent Literature 1: JP-A-2004-241414
Patent Literature 2: JP-A-2006-106616

DISCLOSURE OF INVENTION

Problem to be Solved by the Invention

The problem to be solved by the present invention is to provide a semiconductor surface treating agent composition which is capable of stripping both layers of not only an anti-reflection coating layer but also a resist layer coated thereon in the production process of a semiconductor device and the like easily and in a short time, and further is capable of stripping even a cured resist layer produced in the etching process, as well as a method for treating a semiconductor surface, comprising that the composition is used.

Means for Solving the Problem

An aspect of the present invention is a semiconductor surface treating agent composition, comprising [I] a compound generating a fluorine ion in water, [II] a carbon radical generating agent, [III] water, [IV] an organic solvent, and [V] at least one kind of compound selected from a group consisting of hydroxylamine and a hydroxylamine derivative represented by the general formula [1]:

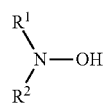

[1]

(wherein $R^1$ represents a linear, branched or cyclic C1-6 alkyl group, or a linear or branched C1-4 substituted alkyl group having 1 to 3 hydroxyl groups; $R^2$ represents a hydrogen atom, a linear, branched or cyclic C1-6 alkyl group, or a linear or branched C1-4 substituted alkyl group having 1 to 3 hydroxyl groups).

In addition, another aspect of the present invention is a method for treating a semiconductor surface, comprising that a semiconductor surface treating agent composition comprising [I] a compound generating a fluorine ion in water, [II] a carbon radical generating agent, [III] water, [IV] an organic solvent, and [V] at least one kind of compound selected from a group consisting of hydroxylamine and a hydroxylamine derivative represented by the above-described general formula [1] is used.

Effects of the Invention

The semiconductor surface treating agent composition of the present invention is capable of stripping an anti-reflection coating layer in the production process of a semiconductor device and the like easily and in a short time without giving any adverse effect to a copper wiring on the surface of a semiconductor substrate, an insulation film such as a Low-k film under the anti-reflection coating layer and the like, and is capable of stripping not only an anti-reflection coating layer but also a resist layer, by combining [IV] an organic solvent, [V] at least one kind of compound selected from a group consisting of hydroxylamine and a hydroxylamine derivative represented by the above-described general formula [1], and the like with [I] a compound generating a fluorine ion (a fluoride ion) in water, [II] a carbon radical generating agent, and [III] water, in a short time and effectively.

In addition, the method for treating a semiconductor surface of the present invention is an effective method for stripping an anti-reflection coating layer and a resist layer easily and in a short time, and by using [II] a carbon radical generating agent as a radical generating source, the anti-reflection coating layer can be stripped off easily without giving any adverse effect to a copper wiring on the surface of a semiconductor substrate and an insulation film such as a Low-k film under the anti-reflection coating layer and the like, as mentioned above.

That is, the present inventors have intensively studied to achieve the above-described purpose. As a result, the inventors have found that not only an anti-reflection coating layer but also even a resist layer can be stripped off effectively without giving any adverse effect to a copper wiring on the surface of a semiconductor substrate and an insulation film such as a Low-k film under the anti-reflection coating layer and the like, by using a composition comprising at least [I] a compound generating a fluorine ion (a fluoride ion) in water, [II] a carbon radical generating agent, [III] water, [IV] an organic solvent, and [V] at least one kind of compound selected from a group consisting of hydroxylamine and a hydroxylamine derivative represented by the above-described general formula [1] (hereinafter, sometimes abbreviated as hydroxylamine or/and a derivative thereof), and also that an anti-reflection coating layer and a resist layer can be stripped off in a shorter time by using hydroxylamine or/and a derivative thereof as a reducing agent, compared with a composition comprising a reducing agent other than hydroxylamine or/and a derivative thereof, and have completed the present invention.

DETAILED DESCRIPTION OF THE INVENTION

A specific example of the linear, branched or cyclic C1-6 alkyl group represented by $R^1$ and $R^2$ in the general formula [1] includes, for example, a methyl group, an ethyl group, an n-propyl group, an isopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, a cyclohexyl group, and the like. Among them, an ethyl group, an n-propyl group and an n-butyl group are preferable, and above all, an ethyl group is more preferable.

A specific example of the linear or branched C1-4 substituted alkyl group having 1 to 3 hydroxyl groups represented by $R^1$ and $R^2$ in the general formula [1] includes, for example, a 1-hydroxyethyl group, a 2-hydroxyethyl group, a 1,2-dihydroxyethyl group, a 2,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,2-dihydroxy-n-propyl group, a 2,3-dihydroxy-n-propyl group, a 3,3-dihydroxy-n-propyl group, a 1,2,3-trihydroxy-n-propyl group, a 2,2,3-trihydroxy-n-propyl group, a 2,3,3-trihydroxy-n-propyl group, a 1-hydroxyisopropyl group, a 2-hydroxyisopropyl group, a 1,1-dihydroxyisopropyl group, a 1,2-dihydroxyisopropyl group, a 1,3-dihydroxyisopropyl group, a 1,2,3-trihydroxyisopropyl group, a 1-hydroxy-n-butyl group, a 2-hydroxy-n-butyl group, a 3-hydroxy-n-butyl group, a 4-hydroxy-n-butyl group, a 1,2-dihydroxy-n-butyl group, a 1,3-dihydroxy-n-butyl group, a 1,4-dihydroxy-n-butyl group, a 2,2-dihydroxy-n-butyl group, a 2,3-dihydroxy-n-butyl group, a 2,4-dihydroxy-n-butyl group, a 3,3-dihydroxy-n-butyl group, a 3,4-dihydroxy-n-butyl group, a 4,4-dihydroxy-n-butyl group, a 1,2,3-trihydroxy-n-butyl group, a 1,2,4-trihydroxy-n-butyl group, a 1,3,4-trihydroxy-n-butyl group, a 2,2,3-trihydroxy-n-butyl group, a 2,2,4-trihydroxy-n-butyl group, a 2,3,3-trihydroxy-n-butyl group, a 3,3,4-trihydroxy-n-butyl group, a 2,4,4-trihydroxy-n-butyl group, a 3,4,4-trihydroxy-n-butyl group, a 2,3,4-trihydroxy-n-butyl group, a 1-hydroxy-sec-butyl group, a 2-hydroxy-sec-butyl group, a 3-hydroxy-sec-butyl group, a 4-hydroxy-sec-butyl group, a 1,1-dihydroxy-sec-butyl group, a 1,2-dihydroxy-sec-butyl group, a 1,3-dihydroxy-sec-butyl group, a 1,4-dihydroxy-sec-butyl group, a 2,3-dihydroxy-sec-butyl group, a 2,4-dihydroxy-sec-butyl group, a 3,3-dihydroxy-sec-butyl group, a 3,4-dihydroxy-sec-butyl group, a 4,4-dihydroxy-sec-butyl group, a 1-hydroxy-2-methyl-n-propyl group, a 2-hydroxy-2-methyl-n-propyl group, a 3-hydroxy-2-methyl-n-propyl group, a 1,2-dihydroxy-2-methyl-n-propyl group, a 1,3-dihydroxy-2-methyl-n-propyl group, a 2,3-dihydroxy-2-methyl-n-propyl group, a 3,3-dihydroxy-2-methyl-n-propyl group, a 3-hydroxy-2-hydroxymethyl-n-propyl group, a 1,2,3-trihydroxy-2-methyl-n-propyl group, a 1,3,3-trihydroxy-2-methyl-n-propyl group, a 2,3,3-trihydroxy-2-methyl-n-propyl group, a 1,3-dihydroxy-2-hydroxymethyl-n-propyl group, a 2,3-dihydroxy-2-hydroxymethyl-n-propyl group, a 1-hydroxy-2-methylisopropyl group, a 1,3-dihydroxy-2-methyl isopropyl group, a 1,3-dihydroxy-2-hydroxymethylisopropyl group, and the like. Among them, a 2,2-dihydroxyethyl group, a 2,3-dihydroxy-n-propyl group, and a 3,3-dihydroxy-n-propyl group are preferable, and among them, a 2,2-dihydroxyethyl group and a 2,3-dihydroxy-n-propyl group are more preferable.

The [I] compound generating a fluorine ion (a fluoride ion) in water in the semiconductor surface treating agent composition of the present invention, specifically, includes a salt of hydrogen fluoride and an inorganic non-metal base such as, for example, ammonium fluoride, hydroxylamine fluoride salt; a salt of hydrogen fluoride and organic base such as, for example, primary to tertiary alkylamine, primary to tertiary alkanolamine, alicyclic amine, heterocyclic amine; fluoride salt of quaternary ammonium; hydrogen fluoride; and the like. Here, the primary to tertiary alkylamine includes a C1-4 alkylamine such as, for example, methylamine, ethylamine, propylamine, butylamine, dimethylamine, diethylamine, dipropylamine, dibutylamine, trimethylamine, triethylamine, tripropylamine, tributylamine. The compound generating a fluorine ion (a fluoride ion) in water which is a salt of hydrogen fluoride and these alkylamines includes, for example, monomethylammonium fluoride, monoethylammonium fluoride, monopropylammonium fluoride, monobutylammonium fluoride, dimethylammonium fluoride, diethylammonium fluoride, dipropylammonium fluoride, dibutylammonium fluoride, trimethylammonium fluoride, triethylammonium fluoride, tripropylammonium fluoride, tributylammonium fluoride, and the like. In addition, the primary to tertiary alkanolamine includes, for example, monoethanolamine, diethanolamine, triethanolamine, and the like, and the compound generating a fluorine ion (a fluoride ion) in water which is a salt of hydrogen fluoride and these alkanolamines includes, for example, monoethanolammonium fluoride, diethanolammonium fluoride, triethanolammonium fluoride, and the like. Further, the alicyclic amine includes, for example, cyclohexylamine, dicyclohexylamine, tricyclohexylamine, and the like, and the compound generating a fluorine ion (a fluoride ion) in water which is a salt of hydrogen fluoride and these alicyclic amines includes, for example, monocyclohexylammonium fluoride, dicyclohexylammonium fluoride, tricyclohexylammonium fluoride, and the like. In addition, the heterocyclic amine includes, for example, pyrrolidine, piperidine, morpholine, pyrrole, pyridine, and the like, and the compound generating a fluorine ion (a fluoride ion) in water which is a salt of hydrogen fluoride and these heterocyclic amines includes, for example, pyrrolidinium fluoride, piperidinium fluoride, morpholinium fluoride, pyrrolinium fluoride, pyridinium fluoride, and the like. Still further, the fluoride salt of quaternary ammonium includes tetramethylammonium fluoride, tetraethylammonium fluoride, tetrapropylammonium fluoride, tetrabutylammonium fluoride, and the like. In addition, as for these compounds generating a fluorine ion (a fluoride ion) in water, one kind of compound may be used alone, or plural kinds of compounds may be used in an appropriate combination.

Among these [I] compounds generating a fluorine ion (a fluoride ion) in water, a salt of hydrogen fluoride and an inorganic non-metal base, and hydrogen fluoride are preferable from the viewpoints of easy industrial availability, economic efficiency, solubility to water, and the like, and above all, a salt of hydrogen fluoride and an inorganic non-metal base is more preferable, and ammonium fluoride is particularly preferable from the viewpoints of easy handling, stripping of an anti-reflection coating layer in a short time, effectively, and the like. It should be noted that when a semiconductor substrate provided with a metal wiring such as a multilayer copper wiring structure and the like, which tends to be adversely affected by an alkali metal, is treated, if an alkali metal exists together in the composition of the present invention, it may cause deterioration of electrical characteristics on the semiconductor substrate. Therefore, use of a salt containing an alkali metal such as lithium fluoride, potassium fluoride, sodium fluoride, that is, a salt of hydrogen fluoride and an inorganic non-metal base is not preferable.

By using the [I] compound generating a fluorine ion (a fluoride ion) in water as mentioned above and [II] a carbon radical generating agent to be mentioned below in combination, it becomes possible to strip an anti-reflection coating layer effectively.

The [II] carbon radical generating agent in the semiconductor surface treating agent composition of the present invention includes a compound which suitably generates a carbon radical by heating or light irradiation. Specifically, the carbon radical generating agent includes a compound which suitably generates a carbon radical by heating such as, for example; azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine)dihydrochloride, 2,2'-azobis[N-(2-carboxyethyl)-2-methylpropionamidine] tetrahydrate; cyclic azoamidine type carbon radical generating agent such as, for example, 2,2'-azobis[2-(2-imidazoline-2-yl)propane] dihydrochloride, 2,2'-azobis[2-(2-imidazoline-2-yl)propane] disulfate, 2,2'-azobis[2-(2-imidazoline-2-yl) propane] dihydrate, 2,2'-azobis{2-[1-(2-hydroxyethyl)-2-imidazoline-2-yl]propane}dihydrochloride, 2,2'-azobis[2-(2-imidazoline-2-yl)propane], 2,2'-azobis(1-imino-1-pyrrolidino-2-methylpropane)dihydrochloride; azoester type carbon radical generating agent such as, for example, dimethyl-2,2'-azobis(2-methylpropionate); azonitrile carboxylic acid type carbon radical generating agent such as, for example, 4,4'-azobis(4-cyanovaleric acid); azoalkyl type carbon radical generating agent such as, for example, 2,2'-azobis (2,4,4-trimethylpentane); and macroazo type carbon radical generating agent such as, for example, dimethylpolysiloxane compound having an azo group in a molecule; and the like: and a compound which suitably generates a carbon radical by light irradiation such as, for example; benzoin alkyl ether type carbon radical generating agent such as, for example, benzoin methyl ether, benzoin ethyl ether, benzoin isopropyl ether, benzoin isobutyl ether; benzylketal type carbon radical generating agent such as, for example, 2,2-dimethoxy-1,2-diphenylethan-1-one; benzophenone type carbon radical generating agent such as, for example, benzophenone, 4,4'-bis (diethylamino)benzophenone, acrylated benzophenone, methyl benzoylbenzoate, 2-banzoylnaphthalene, 4-benzoyl-biphenyl, 4-benzoyl diphenyl ether, 1,4-dibenzoylbenzene, [4-(methylphenylthio)phenyl]phenylmethane; aminobenzoate ester type carbon radical generating agent such as, for example, ethyl p-dimethylaminobenzoate ester, isoamyl ethyl p-dimethylaminobenzoate ester; 1,2-hydroxyalkylphenone type carbon radical generating agent such as, for example, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl) benzyl]phenyl}-2-methylpropan-1-one, 1-hydroxycyclohexylphenylketone; 1,2-aminoalkylphenone type carbon radical generating agent such as, for example, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone;
acylphosphine oxide type carbon radical generating agent such as, for example, 2,4,6-trimethylbenzoylphenylethoxyphosphine oxide, 2,4,6-trimethylbenzoyldiphenylphosphine oxide, bis(2,4,6-trimethylbenzoyl)phenylphosphine oxide; anthraquinone type carbon radical generating agent such as, for example, ethylanthraquinone; thioxanthone type carbon radical generating agent such as, for example, chlorothioxanthone, diethylthioxanthone, isopropylthioxanthone; acridone type carbon radical generating agent such as, for example, 10-butylchloroacridone; imidazole type carbon radical generating agent such as, for example, 2,2'-bis(o-chlorophenyl)-4,5,4',5'-tetraphenyl-1,2'-biimidazole, 2,2'-bis(o-chlorophenyl)-4,5,4',5'-tetrakis(3,4,5-trimethoxyphenyl)-1,2'-biimidazole; oxime ester type carbon radical generating agent such as, for example, 1,2-octandion-1-[4-(phenylthio)-2-(o-benzoyloxime)], ethanon-1-[9-ethyl-6-(2-methylbenzoyl)-9H-carbazol-3-yl]-1-(o-acetyloxime); titanocene type carbon radical generating agent such as, for example, bis(η5-2, 4-cyclopentadiene-1-yl)-bis[2,6-difluoro-3-(1H-pyrrol-1-yl) phenyl]titanium; and the like. In addition, as for these carbon radical generating agents, one kind of compound may be used alone, or plural kinds of compounds may be used in an appropriate combination.

Among these [II] carbon radical generating agents, a compound which suitably generates a carbon radical by heating such as, for example; azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine)dihydrochloride, 2,2'-azobis[N-(2-carboxyethyl)-2-methylpropionamidine] tetrahydrate; cyclic azoamidine type carbon radical generating agent such as, for example, 2,2'-azobis[2-(2-imidazoline-2-yl)propane] dihydrochloride, 2,2'-azobis[2-(2-imidazoline-2-yl)propane] disulfate, 2,2'-azobis[2-(2-imidazoline-2-yl)propane] dihydrate, 2,2'-azobis{2-[1-(2-hydroxyethyl)-2-imidazoline-2-yl]propane}dihydrochloride, 2,2'-azobis[2-(2-imidazoline-2-yl)propane], 2,2'-azobis(1-imino-1-pyrrolidino-2-methylpropane)dihydrochloride; azoester type carbon radical generating agent such as, for example, dimethyl-2,2'-azobis(2-methylpropionate); and the like: and a compound which suitably generates a carbon radical by light irradiation such as, for example; benzoin alkyl ether type carbon radical generating agent such as, for example, benzoin methyl ether, benzoin ethyl ether, benzoin isopropyl ether, benzoin isobutyl ether; benzylketal type carbon radical generating agent such as, for example, 2,2-dimethoxy-1,2-diphenylethan-1-one; benzophenone type carbon radical generating agent such as, for example, benzophenone, 4,4'-bis(diethylamino)benzophenone, acrylated benzophenone, methyl benzoylbenzoate, 2-banzoylnaphthalene, 4-benzoylbiphenyl, 4-benzoyl diphenyl ether, 1,4-dibenzoylbenzene, [4-(methylphenylthio)phenyl]phenylmethane; aminobenzoate ester type carbon radical generating agent such as, for example, ethyl p-dimethylaminobenzoate ester, isoamylethyl p-dimethylaminobenzoate ester; 1,2-hydroxyalkylphenone type carbon radical generating agent such as, for example, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)benzyl]phenyl}-2-methylpropan-1-one, 1-hydroxycyclohexylphenylketone; 1,2-aminoalkylphenone type carbon radical generating agent such as, for example, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone; acylphosphine oxide type carbon radical generating agent such as, for example, 2,4,6-trimethylbenzoylphenylethoxyphosphine oxide, 2,4,6-trimethylbenzoyldiphenylphosphine oxide, bis(2,4,6-trimethylbenzoyl)phenylphosphine oxide; anthraquinone type carbon radical generating agent such as, for example, ethylanthraquinone; thioxanthone type carbon radical generating agent such as, for example, chlorothioxanthone, diethylthioxanthone, isopropylthioxanthone; acridone type carbon radical generating agent such as, for example, 10-butylchloroacridone; imidazole type carbon radical generating agent such as, for example, 2,2'-bis(o-chlorophenyl)-4,5,5',5'-tetraphenyl-1,2'-biimidazole, 2,2'-bis(o-chlorophenyl)-4,5,4',5'-tetrakis(3,4,5-trimethoxyphenyl)-1,2'-biimidazole; oxime ester type carbon radical generating agent such as, for example, 1,2-octandion-1-[4-(phenylthio)-2-(o-benzoyloxime)], ethanon-1-[9-ethyl-6-(2-methylbenzoyl)-9H-carbazol-3-yl]-1-(o-acetyloxime); titanocene type carbon radical generating agent such as, for example, bis(η5-2,4-cyclopentadiene-1-yl)-bis[2,6-difluoro-3-(1H-pyrrol-1-yl)phenyl]titanium; and the like are preferable, and above all, a compound which suitably generates a carbon radical such as azonitrile type carbon radical generating agent by heating such as, for example; azonitrile type carbon radical generating agent such as, for example; 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine)dihydrochloride, 2,2'-azobis[N-(2-carboxyethyl)-2-methylpropionamidine] tetrahydrate; azoester type carbon radical generating agent such as, for example, dimethyl-2,2'-azobis(2-methylpropionate): and a compound which suitably generates a carbon radical by irradiation of light having a wavelength of 200 to 750 nm such as, for example; benzylketal type carbon radical generating agent such as, for example, 2,2-dimethoxy-1,2-diphenylethan-1-one; 1,2-hydroxyalkylphenone type carbon radical generating agent such as, for example, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)benzyl]phenyl}-2-methylpropan-1-one, 1-hydroxycyclohexylphenylketone; 1,2-aminoalkylphenone type carbon radical generating agent such as, for example, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone; and the like are more preferable.

It should be noted that among the above-described [II] carbon radical generating agents, some of the compounds which suitably generate a carbon radical by heating can generate a carbon radical also by light irradiation. Azonitrile type carbon radical generating agent, azoamide type carbon radical generating agent, chain-like azoamidine type carbon radical generating agent, cyclic azoamidine type carbon radical generating agent, azoester type carbon radical generating agent, and the like correspond to the compound which can generate a carbon radical also by light irradiation, and can generate a carbon radical by irradiation of light having a wavelength of 200 to 750 nm. That is, the compound which suitably generates a carbon radical by heating can generate a carbon radical usually only by heating, as mentioned below, but the compound which generates a carbon radical also by light irradiation such as the above-described azonitrile type carbon radical generating agent, azoamide type carbon radical generating agent, chain-like azoamidine type carbon radical generating agent, cyclic azoamidine type carbon radical generating agent, azoester type carbon radical generating agent, and the like may generate a carbon radical not only by a method of heating only, but also by a method of light irradiation only, or a method using heating and light irradiation in combination. On the other hand, the compound which suitably generates a carbon radical by light irradiation means a compound which can easily generate a carbon radical by light irradiation, and does not mean a compound which can not generate a carbon radical by heating. That is, the above-described compound which suitably generates a carbon radical by light irradiation can generate a carbon radical also by heating. As mentioned above, the compound which suitably generates a carbon radical by light irradiation can generate a carbon radical by light irradiation only, but also can generate a carbon radical only by heating or by combined use of heating and light irradiation. In addition, these preferable specific examples of the carbon radical generating agents are useful from the viewpoints of easy industrial availability, economic efficiency, efficient stripping performance for an anti-reflection coating layer in a short time, and the like.

By using a composition in which the [I] compound generating a fluorine ion (a fluoride ion) in water and the [II] carbon radical generating agent as mentioned above are combined for treating a semiconductor surface, it becomes possible to strip off a semiconductor surface layer such as an anti-reflection coating layer. That is, the present inventors have first found that by using a composition comprising these constituents, a surface layer provided for producing a semiconductor such as an anti-reflection coating layer can be stripped off by a simple method such as dipping without carrying out ashing or the like. In addition, the present inventors have also first found that by comprising, besides these constituents, further a component as mentioned below, not only residue of a resist layer adhered to an anti-reflection coating layer can be stripped off simultaneously, but also a resist layer itself and even a cured resist layer formed on the surface of a resist layer can be stripped off together with an anti-reflection coating layer.

In addition, the [II] carbon radical generating agent to be combined with the [I] compound generating a fluorine ion (a fluoride ion) in water can strip off a treatment layer such as an anti-reflection coating layer and the like more effectively, compared with a compound which generates an oxygen radical such as hydrogen peroxide, ozone, and the like. In addition, the [II] carbon radical generating agent is a superior compound which is capable of stripping the above-described layer without giving adverse effect to a Low-k film under the treatment layer and a metal wiring such as copper wiring.

The [III] water in the semiconductor surface treating agent composition of the present invention is not particularly limited, so long as the water does not give an adverse effect to the Low-k film and metal wiring. The water includes, for example, common water, purified water such as, for example, distilled water, deionized water, ultrapure water, and the like, and among them, ultrapure water is preferable. Since ultrapure water contains little impurity, it can be suitably used for a substrate on which a metal wiring such as copper wiring has been provided.

The [IV] organic solvent in the semiconductor surface treating agent composition of the present invention is not particularly limited, so long as the solvent does not give an adverse effect to stripping of an anti-reflection coating layer, and any solvent which is commonly used in this field may be used. Preferably the solvent includes a solvent which is capable of stripping a resist layer together with an anti-reflection coating layer. A specific example of the preferable solvent includes an organic solvent of alcohol type, ester type, amide type or sulfoxide type, and each selected organic solvent itself has a dipole moment of 1.5 to 7.5 debye and a specific gravity in a range of 0.7 to 1.2. More specifically, the solvent includes alcohol type solvent such as, for example, methanol, ethanol, isopropanol, 1-methoxy-2-propanol, ethylene glycol; ester type solvent such as, for example, ethyl acetate, propyl acetate, isobutyl acetate, ethyl lactate, diethyl oxalate, diethyl tartrate, γ-butyrolactone; amide type solvent such as, for example, N-methylpyrolidone; sulfoxide type solvent such as, for example, dimethylsulfoxide, and the like. Among these organic solvents, isopropanol, ethylene glycol, γ-butyrolactone and N-methylpyrolidone, which are capable of stripping a resist layer in a short time and enable to strip off a cured resist layer formed in the etching process which is said to be more difficult to strip off than the resist layer, are more preferable, and above all, isopropanol, γ-butyrolactone and N-methylpyrolidone are further more preferable. In addition, as for these organic solvents, one kind of solvent may be used alone or plural kinds of solvents may be used in an appropriate combination. As an organic solvent in the semiconductor surface treating agent composition of the present invention, a combination of isopropanol and γ-butyrolactone and a combination of isopropanol and N-methylpyrolidone are particularly preferable. It should be noted that when plural kinds of organic solvents are used in combination, as mentioned above a little, a dipole moment or a specific gravity of the organic solvent does not mean a dipole moment or a specific gravity of the solvent mixture obtained by mixing them, but means that a dipole moment of each organic solvent itself to be mixed is 1.5 to 7.5 debye and a specific gravity of each organic solvent itself to be mixed is in a range of 0.7 to 1.2.

The above-described [IV] organic solvent in the semiconductor surface treating agent composition of the present invention enables to strip not only an anti-reflection coating layer, but also a resist layer and even a cured resist layer formed in the etching process which is said to be more difficult to be stripped off than the resist layer.

The [V] at least one kind of compound selected from a group consisting of hydroxylamine and a hydroxylamine derivative represented by the above-described general formula [1] (hydroxylamine or/and a derivative thereof) includes a compound which is commonly used in this field, and specifically includes, for example, hydroxylamine and hydroxylamine derivative including C1-6 mono- or di(bis)alkylhydroxylamine such as, for example, mono- or dimethylhydroxylamine, mono- or diethylhydroxylamine, mono- or di-n-propylhydroxylamine, mono- or diisopropylhydroxylamine, mono- or di-n-butylhydroxylamine, mono- or diisobutylhydroxylamine, mono- or di-sec-butylhydroxylamine, mono- or di-tert-butylhydroxylamine, mono- or dicyclobutylhydroxylamine, mono- or di-n-pentylhydroxylamine, mono- or diisopentylhydroxylamine, mono- or di-sec-pentylhydroxylamine, mono- or di-tert-pentylhydroxylamine, mono- or dineopentylhydroxylamine, mono- or di-2-methylbutylhydroxylamine, mono- or bis(1,2-dimethylpropyl)hydroxylamine, mono- or di-1-ethylpropylhydroxylamine, mono- or dicyclopentylhydroxylamine, mono- or di-n-hexylhydroxylamine, mono- or diisohexylhydroxylamine, mono- or di-sec-hexylhydroxylamine, mono- or di-tert-hexylhydroxylamine, mono- or dineohexylhydroxylamine, mono- or di-2-methylpentylhydroxylamine, mono- or bis(1,2-dimethylbutyl)hydroxylamine, mono- or bis(2,3-dimethylbutyl)hydroxylamine, mono- or di-1-ethylbutylhydroxylamine, mono- or dicyclohexylhydroxylamine; C1-4 mono- or bis(hydroxyalkyl)hydroxylamine such as, for example, mono- or bis(1-hydroxyethyl)hydroxylamine, mono- or bis(2-hydroxyethyl)hydroxylamine, mono- or bis(1,2-dihydroxyethyl)hydroxylamine, mono- or bis(2,2-dihydroxyethyl)hydroxylamine, mono- or bis(1-hydroxy-n-propyl)-1-hydroxylamine, mono- or bis(2-hydroxy-n-propyl)-1-hydroxylamine, mono- or bis(3-hydroxy-n-propyl)-1-hydroxylamine, mono- or bis(1,2-dihydroxy-n-propyl)-1-hydroxylamine, mono- or bis(1,3-dihydroxy-n-propyl)-1-hydroxylamine, mono- or bis(2,2-dihydroxy-n-propyl)-1- hydroxylamine, mono- or bis(2,3-dihydroxy-n-propyl)-1-hydroxylamine, mono- or bis(3,3-dihydroxy-n-propyl)-1-hydroxylamine, mono- or bis(1,2,3-trihydroxy-n-propyl)-1-hydroxylamine, mono- or bis(2,2,3-trihydroxy-n-propyl)-1-hydroxylamine, mono- or bis(2,3,3-trihydroxy-n-propyl)-1-hydroxylamine, mono- or bis(1-hydroxy-n-propyl)-2-hydroxylamine, mono- or bis(2-hydroxy-n-propyl)-2-hydroxylamine, mono- or bis(1,1-dihydroxy-n-propyl)-2-hydroxylamine, mono- or bis(1,2-dihydroxy-n-propyl)-2-hydroxylamine, mono- or bis(1,3-dihydroxy-n-propyl)-2-hydroxylamine, mono- or bis(1,2,3-trihydroxy-n-propyl)-2-hydroxylamine, mono- or bis(1-hydroxy-n-butyl)-1-hydroxylamine, mono- or bis(2-hydroxy-n-butyl)-1-hydroxylamine, mono- or bis(3-hydroxy-n-butyl)-1-hydroxylamine, mono- or bis(4-hydroxy-n-butyl)-1-hydroxylamine, mono- or bis(1,2-dihydroxy-n-butyl)-1-hydroxylamine, mono- or bis(1,3-dihydroxy-n-butyl)-1-hydroxylamine, mono- or bis(1,4-dihydroxy-n-butyl)-1-hydroxylamine, mono- or bis(2,2-dihydroxy-n-butyl)-1-hydroxylamine, mono- or bis(2,3-dihydroxy-n-butyl)-1-hydroxylamine, mono- or bis(2,4-dihydroxy-n-butyl)-1-hydroxylamine, mono- or bis(3,3-dihydroxy-n-butyl)-1-hydroxylamine, mono- or bis(3,4-dihydroxy-n-butyl)-1-hydroxylamine, mono- or bis(4,4-dihydroxy-n-butyl)-1-hydroxylamine, mono- or bis(1,2,3-trihydroxy-n-butyl)-1-hydroxylamine, mono- or bis(1,2,4-trihydroxy-n-butyl)-1-hydroxylamine, mono- or bis(1,3,4-trihydroxy-n-butyl)-1-hydroxylamine, mono- or bis(2,2,3-trihydroxy-n-butyl)-1-hydroxylamine, mono- or bis(2,2,4-trihydroxy-n-butyl)-1-hydroxylamine, mono- or bis(2,3,3-trihydroxy-n-butyl)-1-hydroxylamine, mono- or bis(3,3,4-trihydroxy-n-butyl)-1-hydroxylamine, mono- or bis(2,4,4-trihydroxy-n-butyl)-1-hydroxylamine, mono- or bis(3.4.4-trihydroxy-n-butyl)-1-hydroxylamine, mono- or bis(2,3,4-trihydroxy-n-butyl)-1-hydroxylamine, mono- or bis(1-hydroxy-n-butyl)-2-hydroxylamine, mono- or bis(2-hydroxy-n-butyl)-2-hydroxylamine, mono- or bis(3-hydroxy-n-butyl)-2-hydroxylamine, mono- or bis(1-hydroxy-n-butyl)-3-hydroxylamine, mono- or bis(1,1-dihydroxy-n-butyl)-2-hydroxylamine, mono- or bis(1,2-dihydroxy-n-butyl)-2-hydroxylamine, mono- or bis(1,3-dihydroxy-n-butyl)-2-hydroxylamine, mono- or bis(1,4-dihydroxy-n-butyl)-2-hydroxylamine, mono- or bis(2,3-dihydroxy-n-butyl)-2-hydroxylamine, mono- or bis(2,4-dihydroxy-n-butyl)-2-hydroxylamine, mono- or bis(1,1-dihydroxy-n-butyl)-3-hydroxylamine, mono- or bis(1,2-dihydroxy-n-butyl)-3-hydroxylamine, mono- or bis(2,2-dihydroxy-n-butyl)-3-hydroxylamine, mono- or bis(1-hydroxy-2-methyl-n-propyl)-1-hydroxylamine, mono- or bis(2-hydroxy-2-methyl-n-propyl)-1-hydroxylamine, mono- or bis(3-hydroxy-2-methyl-n-propyl)-1-hydroxylamine, mono- or bis (1,2-dihydroxy-2-methyl-n-propyl)-1-hydroxylamine,
mono- or bis(1,3-dihydroxy-2-methyl-n-propyl)-1-hydroxylamine, mono- or bis(2,3-dihydroxy-2-methyl-n-propyl)-1-hydroxylamine, mono- or bis(3,3-dihydroxy-2-methyl-n-propyl)-1-hydroxylamine, mono- or bis(3-hydroxy-2-hydroxymethyl-n-propyl)-1-hydroxylamine, mono- or bis(1,2,3-trihydroxy-2-methyl-n-propyl)-1-hydroxylamine,
mono- or bis(1,3,3-trihydroxy-2-methyl-n-propyl)-1-hydroxylamine, mono- or bis(2,3,3-trihydroxy-2-methyl-n-propyl)-1-hydroxylamine, mono- or bis(1,3-dihydroxy-2-hydroxymethyl-n-propyl)-1-hydroxylamine, mono- or bis(2,3-dihydroxy-2-hydroxymethyl-n-propyl)-1-hydroxylamine,
mono- or bis(1-hydroxy-2-methyl-n-propyl)-2-hydroxylamine, mono- or bis(1,3-dihydroxy-2-methyl-n-propyl)-2-hydroxylamine, mono- or bis(1,3-dihydroxy-2-hydroxymethyl-n-propyl)-2-hydroxylamine; and C1-6 monoalkyl-mono(hydroxy-C1-4-alkyl)hydroxylamine such as, for example, ethylhydroxymethylhydroxylamine, ethyl-2-hydroxyethylhydroxylamine, ethyl-1,2-dihydroxyethylhydroxylamine, and the like. In addition, as for these compounds, one kind of compound may be used alone or plural kinds of compounds may be used in an appropriate combination.

Among these [V] at least one kind of compounds selected from a group consisting of hydroxylamine and a hydroxylamine derivative represented by the above-described general formula [1] (hydroxylamine or/and a derivative thereof), from the viewpoints of an appropriate reducing performance, easy industrial availability, economic efficiency, and the like, mono- or diethylhydroxylamine, mono- or di-n-propylhydroxylamine, mono- or di-n-butylhydroxylamine, mono- or bis(2,2-dihydroxyethyl)hydroxylamine, mono- or bis(2,3-dihydroxy-n-propyl)hydroxylamine, and mono- or bis(3,3-dihydroxy-n-propyl)hydroxylamine are preferable, and above all, mono- or diethylhydroxylamine, mono- or bis(2,2-dihydroxyethyl)hydroxylamine, and mono- or bis(2,3-dihydroxy-n-propyl)hydroxylamine are more preferable, and further above all, diethylhydroxylamine, bis(2,2-dihydroxyethyl)hydroxylamine, and bis(2,3-dihydroxy-n-propyl)hydroxylamine are particularly preferable.

It should be noted that, as for these hydroxylamine derivatives represented by the above-described general formula [1], a commercially available product may be used, or an appropriately synthesized product by a known method may be used, where, for example, an epoxide such as glycidol is added dropwise to an aqueous solution of hydroxylamine or monoalkyl-substituted hydroxylamine, and the solution is then reacted at an appropriate temperature.

The above-described [V] at least one kind of compound selected from a group consisting of hydroxylamine and a hydroxylamine derivative represented by the general formula [1] enables to strip off a cured resist layer in a further shorter time by a reduction effect thereof by being contained in the semiconductor surface treating agent composition of the present invention. That is, the present inventors have selected hydroxylamine or/and a derivative thereof from a number of reducing agents as a reducing agent in the semiconductor surface treating agent composition of the present invention, and first found that an anti-reflection coating layer and a resist layer can be stripped off in a shorter time compared with a composition comprising a reducing agent other than hydroxylamine or/and a derivative thereof by using these compounds.

Further, it is desirable that the semiconductor surface treating agent composition of the present invention comprises [VI] an acid besides the above-described constituents. By adjusting pH of the solution by adding an acid, for example, not only an adverse effect to an insulation film such as a Low-k film under an anti-reflection coating layer or the like can be reduced, but also formation of hydrogen fluoride in water of the [I] compound generating a fluorine ion (a fluoride ion) in water in the composition is facilitated, and stripping of an anti-reflection coating layer in a shorter time becomes possible.

The above-described [VI] acid includes a compound which has an acidifying effect, and an effect to assist the formation of hydrogen fluoride in water of the compound generating a fluorine ion (a fluoride ion) in water, and specifically includes inorganic acid such as, for example, hydrochloric acid, nitric acid, sulfuric acid, phosphoric acid; organic acid including aliphatic monocarboxylic acid such as, for example, formic acid, acetic acid, trifluoroacetic acid, propionic acid, butyric acid, valeric acid, caproic acid, enanthic acid, caprylic acid, pelargonic acid, capric acid, lauric acid; aliphatic dicarboxylic acid such as, for example, oxalic acid, malonic acid, succinic acid, glutaric acid, adipic acid, pimelic acid, maleic acid, fumaric acid; aliphatic hydroxycarboxylic acid such as, for example, lactic acid, malic acid, tartaric acid, citric acid; aliphatic tricarboxylic acid such as, for example, aconitic acid; aliphatic oxocarboxylic acid such as, for example, pyruvic acid; aromatic monocarboxylic acid such as, for example, benzoic acid; aromatic dicarboxylic acid such as, for example, phthalic acid, isophthalic acid, terephthalic acid; aromatic hydroxycarboxylic acid such as, for example, salicylic acid, gallic acid; aromatic hexacarboxylic acid such as, for example, mellitic acid; and the like. In addition, the above-described [VI] acid may be a form of salt, so long as it shows acidic property. A specific example of the acid salt includes inorganic acid salt including alkali metal salt of inorganic acid such as, for example, sodium dihydrogen phosphate, potassium dihydrogen phosphate, and the like; ammonium salt of inorganic acid such as, for example, ammonium dihydrogen phosphate, and the like; and organic acid salt including alkali metal salt of aliphatic dicarboxylic acid such as, for example, sodium hydrogen oxalate, potassium hydrogen oxalate, sodium hydrogen malonate, potassium hydrogen malonate, sodium hydrogen succinate, potassium hydrogen succinate, sodium hydrogen glutarate, potassium hydrogen glutarate, sodium hydrogen adipate, potassium hydrogen adipate, sodium hydrogen pimelate, potassium hydrogen pimelate, sodium hydrogen maleate, potassium hydrogen maleate, sodium hydrogen fumarate, potassium hydrogen fumarate; ammonium salt of aliphatic dicarboxylic acid such as, for example, ammonium hydrogen oxalate, ammonium hydrogen malonate, ammonium hydrogen succinate, ammonium hydrogen glutarate, ammonium hydrogen adipate, ammonium hydrogen pimelate, ammonium hydrogen maleate, ammonium hydrogen fumarate; alkali metal salt of aliphatic hydroxycarboxylic acid such as, for example, sodium hydrogen malate, potassium hydrogen malate, sodium hydrogen tartarate, potassium hydrogen tartarate, monosodium hydrogen citrate, disodium hydrogen citrate, monopotassium hydrogen citrate, dipotassium hydrogen citrate; ammonium salt of aliphatic hydroxycarboxylic acid such as, for example, ammonium hydrogen malate, ammonium hydrogen tartarate, monoammonium hydrogen citrate, diammonium hydrogen citrate; alkali metal salt of aliphatic tricarboxylic acid such as, for example, monosodium hydrogen aconitate, disodium hydrogen aconitate, monopotassium hydrogen aconitate, dipotassium hydrogen aconitate; ammonium salt of aliphatic tricarboxylic acid such as, for example, monoammonium hydrogen aconitate, diammonium hydrogen aconitate; alkali metal salt of aromatic dicarboxylic acid such as, for example, sodium hydrogen phthalate, potassium hydrogen phthalate, sodium hydrogen isophthalate, potassium hydrogen isophthalate, sodium hydrogen terephthalate, potassium hydrogen terephthalate; ammonium salt of aromatic dicarboxylic acid such as, for example, ammonium hydrogen phthalate, ammonium hydrogen isophthalate, ammonium hydrogen terephthalate; and the like. In addition, as for these acids, one kind of acid may be used alone or plural kinds of acids may be used in an appropriate combination. It should be noted that for the sake of simple explanation, a carboxylic acid having one or more hydroxyl groups in the structure thereof should be classified to hydroxycarboxylic acid regardless of number of the carboxyl group. Further, hydrogen fluoride itself is an acid but also corresponds to the above-described [I] compound generating a fluorine ion (a fluoride ion) in water. Hydrogen fluoride generates hydrogen fluoride in water but does not assist formation thereof. Therefore, hydrogen fluoride should be classified to the above-described [I] compound generating a fluorine ion (a fluoride ion) in water.

Among these [VI] acids, inorganic acid, aliphatic dicarboxylic acid or salt thereof, aliphatic hydroxycarboxylic acid or salt thereof, aliphatic tricarboxylic acid or salt thereof, aromatic dicarboxylic acid or salt thereof, aromatic hydroxycarboxylic acid, and aromatic hexacarboxylic acid are preferable from the viewpoint of solubility to water. Above all, aliphatic dicarboxylic acid or salt thereof, aliphatic hydroxycarboxylic acid or salt thereof, aromatic dicarboxylic acid or salt thereof, and aromatic hydroxycarboxylic acid are more preferable from the viewpoints of easy handling, easy industrial availability, economic efficiency, and the like, above all, oxalic acid, sodium hydrogen oxalate, potassium hydrogen oxalate, ammonium hydrogen oxalate, malonic acid, sodium hydrogen malonate, potassium hydrogen malonate, ammonium hydrogen malonate, succinic acid, sodium hydrogen succinate, potassium hydrogen succinate, ammonium hydrogen succinate, glutaric acid, sodium hydrogen glutarate, potassium hydrogen glutarate, ammonium hydrogen glutarate, adipic acid, sodium hydrogen adipate, potassium hydrogen adipate, ammonium hydrogen adipate, pimelic acid, sodium hydrogen pimelate, potassium hydrogen pimelate, ammonium hydrogen pimelate, maleic acid, sodium hydrogen maleate, potassium hydrogen maleate, ammonium hydrogen maleate, fumaric acid, sodium hydrogen fumarate, potassium hydrogen fumarate, ammonium hydrogen fumarate, malic acid, sodium hydrogen malate, potassium hydrogen malate, ammonium hydrogen malate, tartaric acid, sodium hydrogen tartrate, potassium hydrogen tartrate, ammonium hydrogen tartrate, citric acid, monosodium hydrogen citrate, disodium hydrogen citrate, monopotassium hydrogen citrate, dipotassium hydrogen citrate, monoammonium hydrogen citrate, diammonium hydrogen citrate, phthalic acid, sodium hydrogen phthalate, potassium hydrogen phthalate, and ammonium hydrogen phthalate are furthermore preferable, and still above all, oxalic acid, sodium hydrogen oxalate, potassium hydrogen oxalate, ammonium hydrogen oxalate, malic acid, sodium hydrogen malate, potassium hydrogen malate, ammonium hydrogen malate, tartaric acid, sodium hydrogen tartrate, potassium hydrogen tartrate, ammonium hydrogen tartrate, citric acid, monosodium hydrogen citrate, disodium hydrogen citrate, monopotassium hydrogen citrate, dipotassium hydrogen citrate, monoammonium hydrogen citrate, and diammonium hydrogen citrate are particularly preferable. It should be noted that when a semiconductor substrate where a metal wiring such as a multilayer copper wiring which is adversely affected by an inorganic acid or an alkali metal have been provided is treated, since deterioration of electrical characteristics on the semiconductor substrate may be caused by coexistence of, for example, an inorganic acid such as hydrochloric acid, nitric acid, sulfuric acid, phosphoric acid, or a salt thereof, or an alkali metal salt of an organic acid in the composition of the present invention, it may not be desirable to use an inorganic acid, a salt of inorganic acid, and an alkali metal salt of organic acid.

Further, the semiconductor surface treating agent composition of the present invention may comprise [VII] a surfactant, besides the above-described constituents. By comprising a surfactant, solubilization of the [I] compound generating a fluorine ion (a fluoride ion) in water and the like can be assisted, and the effect of compound generating a fluorine ion (a fluoride ion) in water and the like can be further heightened.

The above-described [VII] surfactant includes a cationic surfactant, an anionic surfactant, a nonionic surfactant, an ampholytic surfactant, and the like which are commonly used in this field. The cationic surfactant specifically includes primary to tertiary alkylamine salts such as, for example, monostearylammonium chloride, distearylammonium chloride, tristearylammonium chloride; quaternary alkylammonium salts such as, for example, monostearyltrimethylammonium chloride, distearyldimethylammonium chloride, stearyldimethylbenzylammonium chloride, monostearyl-bis(polyethoxy)methylammonium chloride; alkylpyridinium salts such as, for example, N-cetylpyridinium chloride, N-stearylpyridinium chloride; N,N-dialkylmorpholinium salts such as, for example, cetylethylmorpholinium ethosulfate, 4-(4,6-dimethoxy-1,3,5-triazin-2-yl)-4-methylmorpholinium chloride; fatty acid amide salts such as, for example, polyethylene polyamine; and the like. In addition, the anionic surfactant specifically includes anionic surfactants having a carboxyl group in a molecule such as, for example, sodium alkylcarboxylate salt, potassium alkylcarboxylate salt, ammonium alkylcarboxylate salt, sodium alkylbenzenecarboxylate salt, potassium alkylbenzenecarboxylate salt, ammonium alkylbenzenecarboxylate salt, sodium polyoxyalkylene alkylethercarboxylate salt, potassium polyoxyalkylene alkylethercarboxylate salt, ammonium polyoxyalkylene alkylethercarboxylate salt, sodium N-acylsarcosine salt, potassium N-acylsarcosine salt, ammonium N-acylsarcosine salt, sodium N-acylglutamate salt, potassium N-acylglutamate salt, ammonium N-acylglutamate salt; anionic surfactants having a sulfonate group in a molecule such as, for example, sodium alkylsulfonate salt, potassium alkylsulfonate salt, ammonium alkylsulfonate salt, sodium alkylbenzenesulfonate salt, potassium alkylbenzenesulfonate salt, ammonium alkylbenzenesulfonate salt, sodium alkylnaphthalenesulfonate salt, potassium alkylnaphthalenesulfonate salt, ammonium alkylnaphthalenesulfonate salt, sodium polyoxyalkylene alkylethersulfonate salt, potassium polyoxyalkylene alkylethersulfonate salt, ammonium polyoxyalkylene alkylethersulfonate salt, sodium N-methyl-N-acyltaurate salt, potassium N-methyl-N-acyltaurate salt, ammonium N-methyl-N-acyltaurate salt, sodium dialkylsulfosuccinate salt, potassium dialkylsulfosuccinate salt, ammonium dialkylsulfosuccinate salt; anionic surfactants having a phosphonate group in a molecule such as, for example, sodium alkylphosphonate salt, potassium alkylphosphonate salt, ammonium alkylphosphonate salt, sodium alkyl benzenephosphonate salt, potassium alkylbenzenephosphonate salt, ammonium alkylbenzenephosphonate salt, sodium polyoxyalkylene alkyletherphosphonate salt, potassium polyoxyalkylene alkyletherphosphonate salt, ammonium polyoxyalkylene alkyletherphosphonate salt; and the like. Further, the nonionic surfactant specifically includes polyoxyethylene alkyl ethers such as, for example, polyoxyethylene stearyl ether; polyoxyethylene alkenyl ethers such as, for example, polyoxyethylene oleyl ether; polyoxyalkylene alkylphenyl ethers such as, for example, polyoxyethylene nonylphenyl ether; polyoxyalkylene glycols such as, for example, polyoxypropylene polyoxyethylene glycol; polyoxyethylene monoalkylates such as, for example, polyoxyethylene monostearate; bispolyoxyethylene alkylamines such as, for example, bispolyoxyethylene stearylamine; bispolyoxyethylene alkylamides such as, for example, bispolyoxyethylene stearylamide; alkylamine oxides such as, for example, N,N-dimethylalkylamine oxide; and the like. Still further, the amphoteric surfactant specifically includes carboxybetaines such as, for example, alkyl-N,N-dimethylaminoacetic acid betaine, alkyl-N,N-dihydroxyethylaminoacetic acid betaine; sulfo betaines such as, for example, alkyl-N,N-dimethylsulfoethyleneammonium betaine; imidazolinium betaines such as, for example, 2-alkyl-N-carboxymethyl-N-hydroxyethylimidazolinium betaine; and the like. In addition, as for these surfactants, one kind of surfactant may be used alone or plural kinds of surfactants may be used in an appropriate combination.

Among the above-described [VII] surfactants, anionic surfactant including anionic surfactants having a carboxyl group in a molecule such as, for example, sodium alkylcarboxylate salt, potassium alkylcarboxylate salt, ammonium alkylcarboxylate salt, sodium alkylbenzenecarboxylate salt, potassium alkylbenzenecarboxylate salt, ammonium alkylbenzenecarboxylate salt, sodium polyoxyalkylene alkylethercarboxylate salt, potassium polyoxyalkylene alkylethercarboxylate salt, ammonium polyoxyalkylene alkylethercarboxylate salt, sodium N-acylsarcosine salt, potassium N-acylsarcosine salt, ammonium N-acylsarcosine salt, sodium N-acylglutamate salt, potassium N-acylglutamate salt, ammonium N-acylglutamate salt; anionic surfactants having a sulfonate group in a molecule such as, for example, sodium alkylsulfonate salt, potassium alkylsulfonate salt, ammonium alkylsulfonate salt, sodium alkylbenzenesulfonate salt, potassium alkylbenzenesulfonate salt, ammonium alkylbenzenesulfonate salt, sodium alkylnaphthalenesulfonate salt, potassium alkylnaphthalenesulfonate salt, ammonium alkylnaphthalenesulfonate salt, sodium polyoxyalkylene alkylethersulfonate salt, potassium polyoxyalkylene alkylethersulfonate salt, ammonium polyoxyalkylene alkylethersulfonate salt, sodium N-methyl-N-acyltaurate salt, potassium N-methyl-N-acyltaurate salt, ammonium N-methyl-N-acyltaurate salt, sodium dialkylsulfosuccinate salt, potassium dialkylsulfosuccinate salt, ammonium dialkylsulfosuccinate salt; anionic surfactants having a phosphonate group in a molecule such as, for example, sodium alkylphosphonate salt, potassium alkylphosphonate salt, ammonium alkylphosphonate salt, sodium alkylbenzenephosphonate salt, potassium alkylbenzenephosphonate salt, ammonium alkylbenzenephosphonate salt, sodium polyoxyalkylene alkyletherphosphonate salt, potassium polyoxyalkylene alkyletherphosphonate salt, ammonium polyoxyalkylene alkyletherphosphonate salt; and the like, and nonionic surfactant including polyoxyethylene alkyl ethers such as, for example, polyoxyethylene stearyl ether; polyoxyethylene alkenyl ethers such as, for example, polyoxyethylene oleyl ether; polyoxyalkylene alkylphenyl ethers such as, for example, polyoxyethylene nonylphenyl ether; polyoxyalkylene glycols such as, for example, polyoxypropylene polyoxyethylene glycol; polyoxyethylene monoalkylates such as, for example, polyoxyethylene monostearate; bispolyoxyethylene alkylamines such as, for example, bispolyoxyethylene stearylamine; bispolyoxyethylene alkylamides such as, for example, bispolyoxyethylene stearylamide; alkylamine oxides such as, for example, N,N-dimethylalkylamine oxide; and the like are preferable from the viewpoints of solubilizing ability to the [I] compound generating a fluorine ion (a fluoride ion) in water and the like, easy industrial availability, economic efficiency, and the like, and above all, anionic surfactants having a sulfonate group in a molecule such as, for example, sodium alkylsulfonate salt, potassium alkylsulfonate salt, ammonium alkylsulfonate salt, sodium alkylbenzenesulfonate salt, potassium alkylbenzenesulfonate salt, ammonium alkylbenzenesulfonate salt, sodium alkylnaphthalenesulfonate salt, potassium alkylnaphthalenesulfonate salt, ammonium alkylnaphthalenesulfonate salt, sodium polyoxyalkylene alkylethersulfonate salt, potassium polyoxyalkylene alkylethersulfonate salt, ammonium polyoxyalkylene alkylethersulfonate salt, sodium N-methyl-N-acyltaurate salt, potassium N-methyl-N-acyltaurate salt, ammonium N-methyl-N-acyltaurate salt, sodium dialkylsulfosuccinate salt, potassium dialkylsulfosuccinate salt, ammonium dialkylsulfosuccinate salt, are more preferable.

Still further, the semiconductor surface treating agent composition of the present invention may further comprise a reducing agent as described below, besides the above-described constituents. By using other reducing agent in addition to hydroxylamine or/and a derivative thereof, stripping of a cured resist layer in a further shorter time can be expected.

The above-described reducing agent includes a reducing agent which is commonly used in this field, and specifically includes hydrazine or a derivative thereof; sulfites such as, for example, sodium sulfite, ammonium sulfite; thiosulfites such as, for example, sodium thiosulfate, ammonium thiosulfite; aldehydes such as, for example, formaldehyde, acetoaldehyde; carboxylic acids having a reducing efficiency such as, for example, formic acid, oxalic acid, succinic acid, lactic acid, malic acid, citric acid, pyruvic acid; ascorbic acid derivative such as, for example, ascorbic acid or ascorbyl ester, isoascorbic acid or isoascorbyl ester; monosaccharide including pentose such as, for example, arabinose, xylose, ribose; hexose such as, for example, glucose, mannose, fructose, galactose; and the like. In addition, as for these reducing agents, one kind of compound may be used alone or plural kinds of compounds may be used in an appropriate combination. It should be noted that among the above-described reducing agents, a carboxylic acid having a reducing efficiency such as, for example, formic acid, oxalic acid, succinic acid, lactic acid, malic acid, citric acid, pyruvic acid, also exhibits an effect as an acid as mentioned above. Therefore, these carboxylic acids having a reducing efficiency as the above-described acid can be used alone as two constituents of acid and reducing agent.

Further, a specific example of the above-described hydrazine derivative includes a compound such as, for example, hydrazine sulfate, hydrazine monohydrochloride, and the like. In addition, a specific example of the above-described ascorbyl ester includes a compound such as, for example, ascorbyl stearate, ascorbyl palmitate, ascorbyl dipalmitate, ascorbyl tetrahexyldecanoate, ascorbyl glucoside, and the like. Still further, a specific example of the above-described isoascorbyl ester includes a compound such as, for example, isoascorbyl stearate, isoascorbyl palmitate, isoascorbyl dipalmitate, isoascorbyl tetrahexyldecanoate, isoascorbyl glucoside, and the like. It should be noted that among ascorbic acid esters and isoascorbic acid esters, since ascorbic acid esters containing alkali metal or alkaline-earth metal such as, for example, sodium ascorbate, ascorbic acid 2-sulfuric acid disodium salt, ascorbic acid 2-phosphoric acid disodium salt, ascorbic acid 2-phosphoric acid magnesium salt, sodium isoascorbate, isoascorbic acid 2-sulfuric acid disodium salt, isoascorbic acid 2-phosphoric acid disodium salt, isoascorbic acid 2-phosphoric acid magnesium salt, may cause deterioration of electrical characteristics on a semiconductor substrate, use of the above-described ascorbic acid ester containing alkali metal and the like is not preferable.

Among the above-described reducing agents, ascorbic acid derivative such as, for example, ascorbic acid or ascorbic acid ester, isoascorbic acid or isoascorbic acid ester, and the like are preferable from the viewpoints of a appropriate reducing efficiency, easy industrial availability, economic efficiency, and the like, and above all, ascorbic acid or ascorbic acid ester is more preferable, and ascorbyl palmitate is further more preferable.

In the semiconductor surface treating agent composition of the present invention, when not only an anti-reflection coating layer but also a resist layer and a cured resist layer as a treatment target are stripped off together with an anti-reflection coating layer, concentration in percent by weight of each constituent in the composition, that is, concentrations in percent by weight of the [I] compound generating a fluorine ion (a fluoride ion) in water, the [II] carbon radical generating agent, the [III] water, the [IV] organic solvent, the [V] at least one kind of compound selected from a group consisting of hydroxylamine and a hydroxylamine derivative represented by the above-described general formula [1], the [VI] acid, and the [VII] surfactant will be explained as follows.

In the semiconductor surface treating agent composition of the present invention, concentration in percent by weight of the [I] compound generating a fluorine ion (a fluoride ion) in water is generally 0.01 to 5% by weight, and preferably 0.01 to 1% by weight based on a weight of the compound generating a fluorine ion (a fluoride ion) to the total weight of the composition.

In the semiconductor surface treating agent composition of the present invention, concentration in percent by weight of the [II] carbon radical generating agent is generally 0.05 to 10% by weight, and preferably 0.1 to 2% by weight based on a weight of the carbon radical generating agent to the total weight of the composition.

In the semiconductor surface treating agent composition of the present invention, concentration in percent by weight of the [III] water is generally 0.02 to 10% by weight, and preferably 0.03 to 7% by weight based on a weight of the water to the total weight of the composition.

In the semiconductor surface treating agent composition of the present invention, concentration in percent by weight of the [IV] organic solvent is generally 80 to 99% by weight, and preferably 85 to 99% by weight based on a weight of the organic solvent to the total weight of the composition.

In the semiconductor surface treating agent composition of the present invention, concentration in percent by weight of the [V] hydroxylamine or/and derivative thereof is generally 0.001 to 5% by weight, and preferably 0.001 to 1% by weight based on a weight of the hydroxylamine or/and derivative thereof to the total weight of the composition.

In the semiconductor surface treating agent composition of the present invention, concentration in percent by weight of the [VI] acid is generally 0.1 to 5% by weight, and preferably 0.1 to 1% by weight based on a weight of the acid to the total weight of the composition.

In the semiconductor surface treating agent composition of the present invention, concentration in percent by weight of the [VII] surfactant is generally 0.05 to 5% by weight, and preferably 0.1 to 3% by weight based on a weight of the surfactant to the total weight of the composition.

Since the semiconductor surface treating agent composition of the present invention comprises the [III] water and the [IV] organic solvent, the composition is used for treatment of the semiconductor surface as it is. However, a range of pH thereof is desirably usually 11 or less to maintain a certain level of stripping performance. In particular, when a lower layer to be stripped off is, for example, a Low-k film, the Low-k film may be dissolved under an alkaline atmosphere, and furthermore a semiconductor substrate may be eroded or slit may be generated in the Low-k film. In order to eliminate a possibility of such adverse effect on the Low-k film, pH of the composition is preferably acidic to neutral, and a range of pH is 7 or less, and more preferably 1 to 4. It should be noted that pH may be appropriately set so as to be in the above-described range by appropriately adjusting kind or concentration of the above-described [VI] acid.

To the semiconductor surface treating agent composition of the present invention, besides the above-described constituents, a component which does not impair the effect of the present invention such as, for example, metal corrosion inhibitor and the like can be appropriately added, if necessary.

A specific example of the metal corrosion inhibitor includes, for example, benzotriazole; benzotriazole derivatives such as, for example, carboxybenzotriazole, aminobenzotriazole; thioureas such as, for example, thiourea; thiol compounds such as, for example, mercaptothiazole, mercaptoethanol, thioglycerol; carboxylic acid derivatives such as, for example, quinoline carboxylic acid; and the like. In addition, as for these metal corrosion inhibitors, one kind of compound may be used alone or plural kinds of compounds may be used in an appropriate combination.

A method for preparing the semiconductor surface treating agent composition of the present invention is not particularly limited, so long as the method is one commonly used in this field. Specifically, the method may be, for example, as follows. That is, a liquid containing a prescribed amount of [III] water is added with [I] a compound generating a fluorine ion (a fluoride ion) in water and [II] a carbon radical generating agent, and then stirred at room temperature, subsequently the solution is added with [IV] an organic solvent and [V] hydroxylamine or/and a derivative thereof while stirring is continued, and then pH of the solution is adjusted to a desired level by adding [VI] an acid if necessary, and [VII] a surfactant is also added if necessary, to prepare the semiconductor surface treating agent composition of the present invention. It should be noted that since the semiconductor surface treating agent composition of the present invention comprises a carbon radical generating agent, it is desirable to prepare the composition under illumination where a light having a specified region of wavelength required for the carbon radical generating agent to generate a carbon radical has been cut out like yellow lamp or the like, in dark place, and at a low temperature such as room temperature or lower, and the like.

Next, a method for treating the semiconductor surface where an anti-reflection coating layer and the like have been provided using the semiconductor surface treating agent composition of the present invention, that is, a preferable means to strip off an anti-reflection coating layer and the like will be explained.

The substrate as a target of the treatment method for the semiconductor surface of the present invention is a substrate or the like which are usually manufactured in the manufacturing processes for semiconductor device, liquid crystal display device and the like, and, for example, a substrate or the like where an anti-reflection coating layer has been coated on the top of a wafer on which a metal wiring such as, for example, a copper wiring and an insulation film such as, for example, a Low-k film have been provided. Among them, a substrate where at least an anti-reflection coating layer has been coated on the top of a wafer on which a Low-k film has been provided is preferable, and above all, a substrate where both layers of at least an anti-reflection coating layer and a resist layer have been coated on the top of a wafer on which a Low-k film has been provided is more preferable, and further above all, a substrate where the surface of the resist layer is a cured resist layer is particularly preferable. It should be noted that depending on a constituent comprised in the semiconductor surface treating agent composition of the present invention, a substrate where a copper wiring has been further provided on the above-described substrate (a semiconductor substrate having a multilayer copper wiring structure) may be desirable.

The anti-reflection coating layer as a target of the method for treating the semiconductor surface of the present invention includes top anti-reflection coating (TARC) layer, bottom anti-reflection coating (BARC) layer, and the like. As mentioned above, since the semiconductor surface treating agent composition of the present invention enables to strip off a resist layer which has become more difficult to be stripped off due to curing of the surface of the resist layer by etching in the etching process of production process of a semiconductor device, that is, a cured resist layer, and therefore is capable of stripping a resist layer and a cured resist layer which have been coated on the top of the anti-reflection coating layer effectively, the anti-reflection coating layer is preferably a bottom anti-reflection coating (BARC) layer. It is needless to say that the semiconductor surface treating agent composition of the present invention can strip off an anti-reflection coating layer coated on the top of a resist layer [top anti-reflection coating (TARC)] layer together with the resist layer.

The above-described anti-reflection coating layer is a coating for the purpose of reducing reflection from the substrate surface and increasing transmission which is commonly used in this field. The anti-reflection coating layer may be any one of for g-line, for i-line, for excimer laser such as KrF, ArF, for electron beam, and for X-ray, but is preferably an anti-reflection coating layer for excimer laser such as KrF, ArF, for electron beam, and for X-ray, and more preferably an anti-reflection coating layer for excimer laser such as KrF, ArF which is made of melamine type material.

A resist layer as a target of the method for treating the semiconductor surface of the present invention is so-called a photoresist film formed from a resist material containing an organic polymer compound. The resist layer may be any one of for g-line, for i-line, for excimer laser such as KrF, ArF, for electron beam, and for X-ray, but is preferably a resist layer for excimer laser such as KrF, ArF. In addition, in the present invention, the treatment method is particularly useful for a resist layer which has become difficult to be stripped off due to curing of the surface of the resist layer by etching, that is, a resist layer containing a cured resist layer.

In addition, the above-described Low-k film includes, for example, a fluorine-containing silicon oxide film or the like which has been coated under a treatment layer such as an anti-reflection coating layer, a resist layer, and means an insulation film (including a porous Low-k film and a ultra-Low-k film) having a specific inductive capacity of 4 or less, and preferably 3 or less.

Here, explanation will be made taking, for example, a substrate where a resist layer has been coated on the top of the above-described anti-reflection coating layer and a cured resist layer has been formed by etching this substrate (a substrate for the purpose of stripping of not only an anti-reflection coating layer, but also a resist layer and even a cured resist layer) as an example of a substrate of a target of the method for treating the semiconductor surface of the present invention.

Firstly, as the semiconductor surface treating agent composition of the present invention, a solution of a composition is prepared by mixing [I] a compound generating a fluorine ion (a fluoride ion) in water, [II] a carbon radical generating agent, [III] water, [IV] an organic solvent, and [V] hydroxylamine or/and a derivative thereof, and further [VI] an acid, [VII] a surfactant, and the like, if necessary in the prescribed concentration ranges as described above. Subsequently, stripping of not only an anti-reflection coating layer but also a resist layer and a cured resist layer, that is, treatment of a semiconductor surface is achieved, by appropriately employing, for example, a method in which the above-described semiconductor substrate is dipped while a light (active energy ray) having a prescribed wavelength is irradiated to the solution; a method in which the above-described semiconductor substrate is dipped while the solution is heated to a prescribed temperature; a method in which the above-described semiconductor substrate is dipped while the above-described light irradiation and the above-described heating are used in combination; and the like.

In the case when a light (active energy ray) having a prescribed wavelength is irradiated, a preferable wavelength of the light (active energy ray) is generally a wavelength of 200 to 750 nm, and preferably a wavelength of 200 to 450 nm. By irradiating a light (active energy ray) having a wavelength in such a preferable range to the semiconductor surface treating agent composition of the present invention, the carbon radical generating agent in the semiconductor surface treating agent composition of the present invention can efficiently generate a carbon radical, and the anti-reflection coating layer becomes to be stripped off in a shorter time and effectively.

In the case when the solution is heated to a prescribed temperature, a preferable temperature in the heating is generally 30 to 70° C., and preferably 30 to 50° C. By heating the semiconductor surface treating agent composition of the present invention to a temperature in such a preferable range, the carbon radical generating agent in the semiconductor surface treating agent composition of the present invention can efficiently generate a carbon radical, and the anti-reflection coating layer becomes to be stripped off in a shorter time and effectively.

In the case when a semiconductor substrate is dipped into the semiconductor surface treating agent composition of the present invention which is irradiated with a light (active energy ray) having the wavelength as mentioned above [the composition with only light irradiation], the semiconductor surface treating agent composition of the present invention which is heated to a prescribed temperature as mentioned above [the composition with only heating], or the semiconductor surface treating agent composition of the present invention which is irradiated with a light (active energy ray) having the wavelength as mentioned above while the solution is heated to a prescribed temperature as mentioned above [the composition with light irradiation and heating in combination], a dipping time is preferably 1 to 30 minutes, and more preferably 1 to 5 minutes.

Among these methods as mentioned above, the method by only light irradiation is a preferable method having such advantages that radical generation from the carbon radical generating agent can be more easily controlled, adverse effect is hardly given to an insulation film such as a Low-k film, and more advantageous in cost-performance ratio, compared with the method by only heating or the method by using heating in combination. For this reason, when a semiconductor surface is treated, it is desirable to employ the method in which the semiconductor surface treating agent composition of the present invention is irradiated with a light (active energy ray) having such a preferable wavelength as mentioned above but is not heated. It should be noted that when a semiconductor surface is required to be treated in a shorter time and efficiently, or the like, the semiconductor surface treating agent composition of the present invention using light irradiation and heating in combination may be sometimes desirable.

A specific example of the above-described dipping method includes a known dipping method including, for example, a method in which a semiconductor substrate is simply placed in the semiconductor surface treating agent composition of the present invention throughout the dipping; a method in which a semiconductor substrate is dipped while the composition is oscillated such as, for example, a method in which a semiconductor substrate is dipped while the semiconductor surface treating agent composition of the present invention is stirred, and, for example, a method in which a semiconductor substrate is dipped while the semiconductor surface treating agent composition of the present invention is bubbled with an inert gas such as nitrogen gas; a method in which a semiconductor substrate is dipped while the semiconductor substrate is transferred such as, for example, a method in which a semiconductor substrate is dipped while the semiconductor substrate is transferred by means of a transferring device such as conveyor; and the like, and any one of these dipping methods may be employed.

Since each of the methods for treating a semiconductor surface as mentioned above is just an example, other method may be also employed. For example, in the case of the dipping method with light irradiation, a method in which a semiconductor substrate is dipped in the semiconductor surface treating agent composition of the present invention which has been irradiated by light before the dipping in advance but is not irradiated with light during the dipping may be employed. In addition, for example, in the case of the dipping method with heating, a method in which a semiconductor substrate is dipped in the semiconductor surface treating agent composition of the present invention which has been set at a prescribed temperature before the dipping in advance but is not heated during the dipping may be employed. Further, the methods for treating a semiconductor surface by dipping were described here, but besides the methods by dipping, a method in which the semiconductor surface treating agent composition of the present invention which has been appropriately heated or/and irradiated with light is coated or sprayed on the semiconductor substrate and the like may be employed. It should be noted that equipment required for light irradiation, heating, dipping, stirring, bubbling, coating, spraying, and the like may be one which is commonly used in this field.

Until now, explanation has been made taking a substrate where a resist layer has been coated on the top of an anti-reflection coating layer, and a cured resist layer has been formed on the surface thereof, as an example of a target substrate of treatment method. However, to a substrate where only an anti-reflection coating layer is coated, a substrate where only an anti-reflection coating layer is remained as a treatment layer by stripping only a cured resist layer and a resist layer from the above-described substrate where a cured resist layer has been formed, or a substrate where an anti-reflection coating layer and a resist layer have been coated but the above-described cured resist layer does not exist, by appropriately employing the above-described methods, stripping of an anti-reflection coating layer or both layers of an anti-reflection coating layer and a resist layer, that is, treatment of a semiconductor surface is, of course, possible. Further, since the semiconductor surface treating agent composition of the present invention can be prepared without containing an oxygen radical generating compound such as an oxygen radical generating agent which is a component to give an adverse effect on a metal wiring such as, for example, a copper wiring, the above-described method is effective, for example, to the treatment of a semiconductor substrate having a multilayer copper wiring structure, and the above-described method can be employed for a semiconductor substrate having a multilayer copper wiring structure.

As mentioned above, the method for treating a semiconductor surface of the present invention does not require the ashing process or the washing (stripping) process for a residue of ashed resist layer after the ashing process and a residue of an anti-reflection coating layer which had been carried out previously, and is a superior treatment method in which stripping of not only an anti-reflection coating layer but also a resist layer and a cured resist layer can be carried out simultaneously only by dipping with heating or light irradiation.

EXAMPLES

Hereinafter, the present invention is specifically explained based on Examples and Comparative Examples, but the present invention is not limited by these Examples. It should be noted that percent in the following Examples and Comparative Examples is based on weight (w/w %) unless otherwise noted.

As a substrate sample for evaluation, a silicon wafer of 300 mm square which had been coated with an anti-reflection coating layer (BARC layer) for ArF composed of a melamine material, and further coated on the top of the anti-reflection coating layer with a resist layer for ArF was used. This substrate sample was subjected to dry etching by an ion spattering to make a substrate with a cured resist layer by forming a cured resist layer on the surface of the resist layer. Subsequently, the substrate was cut to strips having a size of 20 mm×20 mm, and used as a substrate sample for evaluation.

Example 1

Preparation of Semiconductor Surface Treating Agent Composition of the Present Invention (1)

To a solution of water (4.74 g) and sodium alkylsulfosuccinate (Neocol P; produced by Dai-Ichi Kogyo Seiyaku Co., Ltd.) (1.29 g), ammonium fluoride (0.06 g) and 2-benzyl-2-dimethylamino-1-(4-morpholinophenyl)-butanone-1 (Irgacure 369; Ciba Specialty Chemicals Inc.) (0.5 g) were added under irradiation by yellow lamp (straight-tube type yellow fluorescent lamp, FLR40SY-IC/M; manufactured by Mitsubishi Electric Osram Ltd.), and the solution was stirred at room temperature. After confirming dissolution of ammonium fluoride and Irgacure 369, γ-butyrolactone (93 g) was added to the solution while stirring was continued, and further diethylhydroxylamine (0.01 g), and then citric acid (0.4 g) were added thereto, respectively, to prepare composition of the present invention (1) which showed pH 2.

Examples 2 to 18

Preparations of Semiconductor Surface Treating Agent Compositions of the Present Invention (2) to (18)

In Examples 2 to 18, compositions of the present invention (2) to (18) were prepared in the same method as in Example 1, except that each constituent as shown in Table 1 and Table 2 was used in an amount as shown in Table 1 and Table 2. These compositions are shown in Table 1 and Table 2 together with the composition of Example 1. It should be noted that numerals shown in Table 1 and Table 2 mean concentrations in percent by weight of each constituent based on the total weight of the composition as 100%.

TABLE 1

| | | Example | | | | | | | | |
|---|---|---|---|---|---|---|---|---|---|---|
| | | 1 | 2 | 3 | 4 | 5 | 6 | 7 | 8 | 9 |
| Composition of the present invention | | (1) | (2) | (3) | (4) | (5) | (6) | (7) | (8) | (9) |
| Compound generating a fluorine ion | Ammonium fluoride | 0.06 | 0.06 | 0.06 | 0.06 | 0.06 | 0.06 | 0.06 | 0.06 | 0.06 |
| Carbon radical generating agent | Irgacure 369 | 0.5 | 0.5 | 0.5 | 0.5 | 0.5 | 0.5 | 0.5 | 0.5 | 0.5 |
| Water | Water | 4.74 | 4.74 | 4.74 | 4.74 | 4.74 | 4.74 | 4.74 | 5.14 | 4.74 |
| Organic solvent | γ-Butyrolactone | 93 | 63 | 50 | 50 | 93 | 50 | 50 | 50 | 50 |
| | Isopropanol | | 30 | 43 | 43 | | 43 | 43 | 43 | 43 |
| Acid | Citric acid | 0.4 | 0.4 | 0.4 | 0.4 | 0.4 | 0.4 | | | |
| | Sulfuric acid | | | | | | | 0.4 | | |
| | Disodium citrate | | | | | | | | | 0.4 |
| Hydroxylamine or/and derivative thereof | Diethylhydroxylamine | 0.01 | 0.01 | 0.01 | | | | | | |
| | Bis-2,2-dihydroxy-ethylhydroxylamine | | | | 0.01 | | | | | |
| | Bis-2,3-dihydroxy-n-propylhydroxylamine | | | | | 0.01 | 0.01 | 0.01 | 0.01 | 0.01 |
| Surfactant | Neocol P | 1.29 | 1.29 | 1.29 | 1.29 | 1.29 | 1.29 | 1.29 | 1.29 | 1.29 |
| pH | | 2 | 2 | 2 | 2 | 2 | 2 | 2 | 6 | 4 |

Irgacure 369: 2-Benzyl-2-dimethylamino-1-(4-morpholinophenyl)-butanone-1
Neocol P: Sodium alkylsulfosuccinate

TABLE 2

| | | Example | | | | | | | | |
|---|---|---|---|---|---|---|---|---|---|---|
| | | 10 | 11 | 12 | 13 | 14 | 15 | 16 | 17 | 18 |
| Composition of the present invention | | (10) | (11) | (12) | (13) | (14) | (15) | (16) | (17) | (18) |
| Compound generating a fluorine ion | Ammonium fluoride | 0.06 | 0.06 | 0.06 | 0.06 | 0.06 | 0.06 | 0.06 | 0.06 | 0.06 |

TABLE 2-continued

|  |  | Example |  |  |  |  |  |  |  |  |
|---|---|---|---|---|---|---|---|---|---|---|
|  |  | 10 | 11 | 12 | 13 | 14 | 15 | 16 | 17 | 18 |
| Carbon radical generating agent | Irgacure 369 | 0.5 | 0.5 |  |  |  |  |  |  |  |
|  | VA-057 |  |  | 0.5 |  | 0.5 |  |  |  |  |
|  | V-70 |  |  |  | 0.5 |  |  |  |  |  |
|  | V-601 |  |  |  |  |  | 0.5 |  |  |  |
|  | VA-086 |  |  |  |  |  |  | 0.5 |  |  |
|  | Irgacure 184 |  |  |  |  |  |  |  | 0.5 |  |
|  | Irgacure 651 |  |  |  |  |  |  |  |  | 1 |
| Water | Water | 4.74 | 4.74 | 4.74 | 4.74 | 4.74 | 4.74 | 4.74 | 4.74 | 4.74 |
| Organic solvent | γ-Butyrolactone |  | 50 | 50 | 50 | 93 | 93 | 93 | 93 | 92.5 |
|  | N-Methylpyrolidone | 50 |  |  |  |  |  |  |  |  |
|  | Isopropanol | 43 | 43 | 43 | 43 |  |  |  |  |  |
| Acid | Citric acid | 0.4 | 0.4 | 0.4 | 0.4 | 0.4 | 0.4 | 0.4 | 0.4 | 0.4 |
| Hydroxylamine or/and derivative thereof | Bis-2,3-dihydroxy-n-propylhydroxylamine | 0.01 | 0.01 | 0.01 | 0.01 | 0.01 | 0.01 | 0.01 | 0.01 | 0.01 |
| Surfactant | Neocol P | 1.29 |  | 1.29 | 1.29 | 1.29 | 1.29 | 1.29 | 1.29 | 1.29 |
|  | NCW-1004 |  | 1.29 |  |  |  |  |  |  |  |
| pH |  | 2 | 2 | 2 | 2 | 2 | 2 | 2 | 2 | 2 |

Irgacure 369: 2-Benzyl-2-dimethylamino-1-(4-morpholinophenyl)-butanone-1
VA-057: 2,2'-Azobis[N-(2-carboxylethyl)-2-methylpropionamidine] tetrahydrate
V-70: 2,2'-Azobis(4-methoxy-2,4-dimethylvaleronitrile)
V-601: Dimethyl-2,2'-azobis(2-methylpropionate)
V-086: 2,2'-Azobis[2-methyl-N-(2 hydroxylethyl)propionamide]
Irgacure 184: 1-Hydroxycyclohexyl phenyl ketone
Irgacure 651: 2,2-Dimethoxy-1,2-diphenylethan-1-one
Neocol P: Sodium alkylsulfosuccinate
NCW-1004: Polyoxyalkylene alkylphenyl ether Example 19

Evaluation of Semiconductor Surface Treating Agent Composition of the Present Invention (1)

In composition of the present invention (1) (50 mL) prepared in Example 1, the above-described substrate sample for evaluation was dipped for 3 minutes at room temperature under gentle stirring, while the composition was irradiated with a light having a central wavelength of 320 nm using a ultraviolet irradiation equipment (UV irradiation equipment, MUV-35U with MUV-PF001 filter; manufactured by Moritex Corp.). After that, the substrate sample was rinsed with pure water for 30 seconds, and then the substrate surface was dried with compressed air. The substrate sample after drying was observed by visual check and using a field-emission type electron microscope (S-4800; Hitachi High-Technologies Corp.), and it could be confirmed that a resist layer and a cured resist layer had been well stripped off without remaining any residue, and 90% or more of an anti-reflection coating layer had been stripped off. As a result, it was found that by dipping the substrate sample for evaluation in the composition of the present invention for 3 minutes under stirring and light irradiation, not only an anti-reflection coating layer (BARC layer) but also a resist layer and a cured resist layer could be stripped off simultaneously.

Examples 20 to 36

Evaluations of Semiconductor Surface Treating Agent Compositions of the Present Invention (2) to (18)

In Examples 20 to 36, dipping for a prescribed time in each of semiconductor surface treating agent compositions of the present invention (2) to (18) was carried out in the same method as in Example 19, and stripping performances for a resist layer, a cured resist layer, and an anti-reflection coating layer were observed by visual check and using a field-emission type electron microscope (S-4800; Hitachi High-Technologies Corp.). These results are shown in Table 3 together with results of Example 19.

TABLE 3

|  |  |  | Stripping performance |  |  |
|---|---|---|---|---|---|
| Example | Composition of the present invention | Dipping time | Resist layer | Resist cured layer | Anti-reflection coating layer |
| 19 | (1) | 3 min | ⊚ | ⊚ | ⊚ |
| 20 | (2) | 3 min | ⊚ | ⊚ | ⊚ |
| 21 | (3) | 3 min | ⊚ | ⊚ | ⊚ |
| 22 | (4) | 3 min | ⊚ | ⊚ | ⊚ |
| 23 | (5) | 3 min | ⊚ | ⊚ | ⊚ |
| 24 | (6) | 3 min | ⊚ | ⊚ | ⊚ |
| 25 | (7) | 3 min | ⊚ | ⊚ | ⊚ |
| 26 | (8) | 15 min | ⊚ | ⊚ | ○ |
| 27 | (9) | 3 min | ⊚ | ⊚ | ⊚ |
| 28 | (10) | 3 min | ⊚ | ⊚ | ⊚ |
| 29 | (11) | 3 min | ⊚ | ⊚ | ⊚ |
| 30 | (12) | 3 min | ⊚ | ⊚ | ⊚ |
| 31 | (13) | 3 min | ⊚ | ⊚ | ⊚ |
| 32 | (14) | 5 min | ⊚ | ⊚ | ⊚ |
| 33 | (15) | 5 min | ⊚ | ⊚ | ⊚ |
| 34 | (16) | 5 min | ⊚ | ⊚ | ⊚ |
| 35 | (17) | 5 min | ⊚ | ⊚ | ⊚ |
| 36 | (18) | 5 min | ⊚ | ⊚ | ○ |

⊚: Stripped off in a degree of 90% or more
○: Stripped off in a degree of 60% or more but less than 90%
△: Stripped off in a degree of 30% or more but less than 60%
X: Stripped off in a degree of less than 30%

From the results of Examples 19 to 29, it was found that in any composition in which a carbon radical generating agent is a compound suitably generating a carbon radical by light irradiation (photo radical generating agent), not only an anti-reflection coating layer (BARC layer) but also a resist layer and a cured resist layer could be well stripped off. In addition, from the results of Examples 30 to 36, it was found that various radical generating compounds could be used as a carbon radical generating agent in the semiconductor surface treating agent composition of the present invention, and also the followings were found. That is, a carbon radical generating agent such as azonitrile type carbon radical generating agent, azoamide type carbon radical generating agent, chain-like azoamidine type carbon radical generating agent, cyclic azoamidine type carbon radical generating agent, azoester type carbon radical generating agent, and the like suitably generated a carbon radical by heating. By using these carbon radical generating agents and generating a carbon radical by light irradiation, not only an anti-reflection coating layer (BARC layer) but also a resist layer and a cured resist layer could be also well stripped off. Further, from comparisons of the results of Example 26 (using composition of the present invention (8)) and the results of Examples 19 to 25 and 27 to 36, it was found that an anti-reflection coating layer (BARC layer) and the like could be stripped off in a shorter time by adding an acid to assist generation of hydrogen fluoride and making the solution acidic showing pH of 4 or less.

Example 37

Evaluation of Semiconductor Surface Treating Agent Composition of the Present Invention (15)

Composition of the present invention (15) (50 mL) prepared in Example 15 was warmed up to 40° C. in advance, and heated for 10 minutes. The above-described substrate sample for evaluation was dipped in this heated solution under gentle stirring for 3 minutes. During the dipping, the composition was not heated. After that, the substrate sample was rinsed with pure water for 30 seconds, and then the substrate surface was dried with compressed air. The substrate sample after drying was observed by visual check and using a field-emission type electron microscope (S-4800; Hitachi High-Technologies Corp.), it could be confirmed that all of a resist layer, a cured resist layer, and an anti-reflection coating layer had been well stripped off. As a result, it was found that by dipping the substrate sample for evaluation in the composition of the present invention which had been heated in advance for 3 minutes under stirring, not only an anti-reflection coating layer (BARC layer) but also a resist layer and a cured resist layer could be stripped off simultaneously.

From the results of Example 37, it was found that when VA-601 which was a compound suitably generating a carbon radical by heating (thermal radical generating agent) was used as a carbon radical generating agent, by generating a carbon radical by heating instead of light irradiation, not only an anti-reflection coating layer (BARC layer) but also a resist layer and a cured resist layer could be well stripped off. In addition, it was found that even when same evaluation was carried out using the solution (the semiconductor surface treating agent composition of the present invention) which had been heated in advance but without heating during the dipping, a resist layer and a cured resist layer could be well stripped off.

Example 38

Evaluation of Copper Wiring Using Semiconductor Surface Treating Agent Composition of the Present Invention (6)

A copper plate having a size of 20 mm×20 mm in which an oxide layer was removed by dipping in 0.1 N sulfuric acid aqueous solution for 5 minutes was dipped in a solution of composition of the present invention (6) (50 mL) prepared in Example 6 at room temperature for 10 minutes. Subsequently, after taking out the copper plate from the dipping liquid, copper contained in the dipping liquid was quantitatively analyzed by a frameless atomic absorption spectroscopy. As a result, an etching rate was confirmed from the analyzed value and found to be $4.0 \times 10^{-6}$ nm/min. From this value, it was confirmed that copper had been little eluted into the dipping liquid. From this result, it was found that even if the semiconductor surface treating agent composition of the present invention is used for a semiconductor substrate where copper wiring has been provided, the composition does not give any adverse effect to the surface of copper wiring.

It has been known that, for example, when a radical generating agent to generate an oxygen radical (oxygen radical generating agent) such as hydrogen peroxide is used as a radical generating agent, the composition gives such an adverse effect that oxide layer is formed cupper surface or the like. However, from the results of Example 38, it was found that the composition of the present invention did not give such adverse effect to the copper surface. From this result, it was found that, for example, even in the case when a semiconductor substrate is one having a multilayer copper wiring structure, the composition of the present invention could well strip off not only an anti-reflection coating layer but also a resist layer and a cured resist layer, without giving any adverse effect to the surface of copper layer.

Reference Example 1

Preparation of Composition for Stripping Anti-Reflection Coating Layer (1)

Ammonium fluoride (0.06 g) and 2-benzyl-2-dimethylamino-1-(4-morpholinophenyl)-butanone-1 (Irgacure 369; produced by Ciba Specialty Chemicals Inc.) (0.5 g) were added to water (99.44 g), under irradiation by yellow lamp (straight-tube type yellow fluorescent lamp, FLR40SY-IC/M; manufactured by Mitsubishi Electric Osram Ltd.), and the solution was stirred at room temperature to prepare composition for stripping anti-reflection coating layer (1) showing pH 6.

Reference Examples 2 to 3

Preparation of Compositions for Stripping Anti-Reflection Coating Layer (2) to (3)

In Reference Examples 2 to 3, compositions for stripping anti-reflection coating layer (2) to (3) were prepared in the same method as in Reference Example 1, except that each constituent as shown in Table 4 was used in an amount as shown in Table 4. These compositions are shown in Table 4 together with the composition of Reference Example 1. It should be noted that numerals shown in Table 4 mean concentrations in percent by weight of each constituent based on the total weight of the composition as 100%.

TABLE 4

|  | Reference Example | | |
| --- | --- | --- | --- |
|  | 1 | 2 | 3 |
| Composition for stripping anti-reflection coating layer | (1) | (2) | (3) |

TABLE 4-continued

|  |  | Reference Example | | |
|---|---|---|---|---|
|  |  | 1 | 2 | 3 |
| Compound generating a fluorine ion in water | Ammonium fluoride | 0.06 | 0.06 | 0.06 |
| Carbon radical generating agent | Irgacure 369 | 0.5 | 0.5 |  |
|  | V-70 |  |  | 0.5 |
| Water | Water | 99.44 | 99.04 | 99.04 |
| Acid | Citric acid |  | 0.4 |  |
|  | Disodium citrate |  |  | 0.4 |
| pH |  | 6 | 3 | 4 |

Irgacure 369: 2-Benzyl-2-dimethylamino-1-(4-morpholinophenyl)-butanone-1
V-70: V-70: 2,2'-Azobis(4-methoxy-2,4-dimethylvaleronitrile)

Reference Example 4

Preparation of Composition for Comparison and Reference (1)

Ammonium fluoride (0.06 g) was added to water (99.94 g), and the solution was stirred at room temperature, to prepare composition for comparison and reference (1) showing pH 6.

Reference Example 5

Evaluation of Composition for Stripping Anti-Reflection Coating Layer (1)

In composition for stripping anti-reflection coating layer (1) (50 mL) prepared in Reference Example 1, a silicon substrate where only an anti-reflection coating layer had been coated was dipped at room temperature under gentle stirring, while the composition was irradiated with a light having a central wavelength of 320 nm using a ultraviolet irradiation equipment (UV irradiation equipment, MUV-35U with MUV-PF001 filter; manufactured by Moritex Corp.), and stripping of the anti-reflection coating layer during dipping was observed by visual check. As a result, after dipping for 3 minutes, stripping of the anti-reflection coating layer could be confirmed, and after dipping for 15 minutes, complete stripping of the anti-reflection coating layer was confirmed.

Reference Example 6

Evaluation of Composition for Stripping Anti-Reflection Coating Layer (2)

In Reference Example 6, stripping of an anti-reflection coating layer was observed by visual check by dipping in the same method as in Reference Example 5, except that composition for stripping anti-reflection coating layer (2) prepared in Reference Example 2 was used. As a result, in the case when composition for stripping anti-reflection coating layer (2) was used, after dipping for 3 minutes, complete stripping of the anti-reflection coating layer was confirmed.

Reference Example 7

Evaluation of Composition for Stripping Anti-Reflection Coating Layer (3)

Composition for stripping anti-reflection coating layer (3) (50 mL) prepared in Reference Example 3 was warmed up to 40° C., and heated for 10 minutes. A silicon substrate where only an anti-reflection coating layer had been coated was dipped in the heated solution under gentle stirring, and stripping of the anti-reflection coating layer during dipping was observed by visual check. As a result, after dipping for 3 minutes, complete stripping of the anti-reflection coating layer was confirmed.

Reference Example 8

Evaluation of Composition for Comparison and Reference (1)

In composition for comparison and reference (1) (50 mL) prepared in Reference Example 4, a silicon substrate where only an anti-reflection coating layer had been coated was dipped at room temperature under gentle stirring, while the composition was irradiated with a light having a central wavelength of 320 nm using a ultraviolet irradiation equipment (UV irradiation equipment, MUV-35U with MUV-PF001 filter; manufactured by Moritex Corp.), and stripping of the anti-reflection coating layer during dipping was observed by visual check. However, although dipping was continued for 30 minutes, the anti-reflection coating layer could not be stripped off at all.

Reference Examples 9 to 10

Evaluation of Compositions for Stripping Anti-Reflection Coating Layer (1) to (2) without Light Irradiation In compositions for stripping anti-reflection coating layer (1) to (2) (50 mL each) prepared in Reference Examples 1 and 2, respectively, a silicon substrate where only an anti-reflection coating layer had been coated was dipped at room temperature under gentle stirring without UV irradiation, and stripping of the anti-reflection coating layer during dipping was observed by visual check. However, although dipping was continued for 30 minutes, the anti-reflection coating layer could not be stripped off at all.

Reference Example 11

Evaluation of Composition for Stripping Anti-Reflection Coating Layer (3) without Heating In composition for stripping anti-reflection coating layer (3) (50 mL) prepared in Reference Examples 3, a silicon substrate where only an anti-reflection coating layer had been coated was dipped at room temperature under gentle stirring without heating, and stripping of the anti-reflection coating layer during dipping was observed by visual check. However, although dipping was continued for 30 minutes, the anti-reflection coating layer could not be stripped off at all.

From the results of Reference Examples 5 to 8, it was found that only by using [I] a compound generating a fluorine ion (a fluoride ion) in water and [II] a carbon radical generating agent in combination, an anti-reflection coating layer could be stripped off, and also found that even a composition using any one of a compound suitably generating a carbon radical by heating (thermal radical generating agent) and a compound suitably generating a carbon radical by light irradiation (photo radical generating agent) as a carbon radical generating agent, the anti-reflection coating layer could be well stripped off. In addition, from the results of Reference Examples 9 to 11, it was found that a carbon radical generated from a carbon radical generating agent was necessary for stripping of the anti-reflection coating layer, because even a composition for stripping anti-reflection coating layer which comprised a carbon radical generating agent, the anti-reflection coating layer could not be stripped off unless heating or light irradiation was carried out.

Examples 39 to 40

Preparation of Semiconductor Surface Treating Agent Composition of the Present Invention (19) to (20)

In Examples 39 to 40, semiconductor surface treating agent composition of the present invention (19) to (20) were prepared in the same method as in Example 1, except that acetone or dimethylformamide (DMF) were used in an amount as shown in Table 5 instead of γ-butyrolactone as an organic solvent in the composition of the present invention. These compositions are shown in Table 5. It should be noted that numerals shown in Table 5 mean concentrations in percent by weight of each constituent based on the total weight of the composition as 100%.

TABLE 5

|  |  | Example | |
|---|---|---|---|
|  |  | 39 | 40 |
| Composition of the present invention | | (19) | (20) |
| Compound generating a fluorine ion in water | Ammonium fluoride | 0.06 | 0.06 |
| Carbon radical generating agent | Irgacure 369 | 0.5 | 0.5 |
| Water | Water | 4.74 | 4.74 |
| Organic solvent | Acetone | 50 | |
|  | DMF | | 50 |
|  | Isopropanol | 43 | 43 |
| Acid | Citric acid | 0.4 | 0.4 |
| Hydroxylamine or/and derivative thereof | Bis-2,3-dihydroxy-n-propylhydroxyl amine | 0.01 | 0.01 |
| Surfactant | Neocol P | 1.29 | 1.29 |
| pH | | 2 | 2 |

Irgacure 369: 2-Benzyl-2-dimethylamino-1-(4-morpholinophenyl)-butanone-1
DMF: Dimethylformamide
Neocol P: Sodium alkylsulfosuccinate Examples 41 to 42

Evaluation of Semiconductor Surface Treating Agent Compositions of the Present Invention (19) to (20)

In semiconductor surface treating agent compositions of the present invention (19) and (20) (50 mL each) prepared in Examples 39 and 40, respectively, the above-described substrate sample for evaluation was dipped for 30 minutes at room temperature under gentle stirring, while each composition was irradiated with a light having a central wavelength of 320 nm using a ultraviolet irradiation equipment (UV irradiation equipment, MUV-35U with MUV-PF001 filter; manufactured by Moritex Corp.). However, although dipping was continued for 30 minutes, a resist layer and a cured resist layer could not be stripped off, and an anti-reflection coating layer (BARC layer) in the bottom thereof could also hardly stripped off. It should be noted that when a silicon substrate where only an anti-reflection coating layer had been coated was dipped in the above-described semiconductor surface treating agent compositions of the present invention (19) and (20) under the same conditions, complete stripping of the anti-reflection coating layer was confirmed.

From the results of Examples 41 to 42, it was found that in order to strip off a resist layer and a cured resist layer together with an anti-reflection coating layer (BARC layer), it was preferable to use a specified organic solvent among organic solvents. In addition, followings were found. That is, as obvious from the fact that an anti-reflection coating layer could be stripped off by using a compound generating a fluorine ion (a fluoride ion) in water and a carbon radical generating agent in combination as shown in the results of Reference Examples 5 to 7, semiconductor surface treating agent compositions of the present invention (19) and (20) could exhibit sufficiently their effects when they were used for stripping only an anti-reflection coating layer, but could hardly exhibit their effects when they were used for stripping a resist layer and a cured resist layer together with an anti-reflection coating layer, and when a resist layer and a cured resist layer had to be stripped off together with an anti-reflection coating layer, it was preferable to use a specified organic solvent as mentioned above.

Comparative Examples 1 to 3

Preparation of Compositions for Comparison (1) to (3)

Compositions for comparison (1) to (3) were prepared in the same method as in Example 1, except that hydroxylamine or/and a derivative thereof as a reducing agent was not used in Comparative Example 1, and ascorbyl palmitate as a reducing agent was used instead of hydroxylamine or/and a derivative thereof in Comparative Examples 2 to 3 in each amount as shown in Table 6. These compositions are shown in Table 6 together with the composition of Example 1. It should be noted that numerals shown in Table 6 mean concentrations in percent by weight of each constituent based on the total weight of the composition as 100%.

TABLE 6

| | | Example | | | |
|---|---|---|---|---|---|
| | | Comparative Example 1 | Comparative Example 2 | Comparative Example 3 | Example 1 |
| | Composition | Composition for comparison (1) | Composition for comparison (2) | Composition for comparison (3) | Composition of the present invention (1) |
| Compound generating a fluorine ion in water | Ammonium fluoride | 0.06 | 0.06 | 0.06 | 0.06 |
| Carbon radical generating agent | Irgacure 369 | 0.5 | 0.5 | 0.5 | 0.5 |

TABLE 6-continued

| | | Comparative Example 1 | Comparative Example 2 | Comparative Example 3 | Example 1 |
|---|---|---|---|---|---|
| Water | Water | 4.74 | 1.94 | 4.74 | 4.74 |
| Organic solvent | γ-Butyrolactone | 93.01 | 96 | 93 | 93 |
| Acid | Citric acid | 0.4 | 0.2 | 0.4 | 0.4 |
| Reducing agent | Diethylhydroxylamine | | | | 0.01 |
| | Ascorbil palmitate | | 0.01 | 0.01 | |
| Surfactant | Neocol P | 1.29 | 1.29 | 1.29 | 1.29 |
| pH | | 2 | 2 | 2 | 2 |

Irgacure 369: 2-Benzyl-2-dimethylamino-1-(4-morpholinophenyl)-butanone-1
Neocol P: Neocol P: Sodium alkylsulfosuccinate Comparative Examples 4 to 6

Evaluation of Compositions for Comparison (1) to (2)

In Comparative Examples 4 to 6, dipping for a prescribed time in each of compositions for comparison (1) to (2) was carried out in the same method as in Example 19, and stripping performances for a resist layer, a cured resist layer, and an anti-reflection coating layer were observed by visual check and using a field-emission type electron microscope (S-4800; Hitachi High-Technologies Corp.). These results are shown in Table 7 together with the results of Example 19 where composition of the present invention (1) was used. It should be noted that composition for comparison (3) prepared in Comparative Example 3 was eliminated from the target composition for evaluation because ascorbyl palmitate had deposited as a solid from the solution after preparation.

TABLE 7

| | | | Stripping performance | | |
|---|---|---|---|---|---|
| Example | Composition | Dipping time | Resist layer | Cured resist layer | Anti-reflection coating layer |
| Comparative Example 4 | Composition for comparison (1) | 3 min | X | Δ | X |
| Comparative Example 5 | Composition for comparison (1) | 60 min | ○ | ○ | ○ |
| Comparative Example 6 | Composition for comparison (2) | 5 min | ◎ | ◎ | ◎ |
| Example 19 | Composition of the present invention (1) | 3 min | ◎ | ◎ | ◎ |

◎: Stripped off in a degree of 90% or more
○: Stripped off in a degree of 60% or more but less than 90%
Δ: Stripped off in a degree of 30% or more but less than 60%
X: Stripped off in a degree of less than 30%

From the results of Comparative Examples 4 to 6 and Example 19, it was found that only by using hydroxylamine or/and a derivative thereof as a reducing agent in the semiconductor surface treating agent composition of the present invention, an anti-reflection coating layer (BARC layer), a resist layer, and a cured resist layer could be stripped off in a further shorter time and efficiently. That is, it was found that in the evaluation using composition for comparison (1) where a reducing agent was not used (Comparative Examples 4 to 5), after dipping for 3 minutes, a cured resist layer could be hardly stripped off and therefore stripping of a resist layer and an anti-reflection coating layer in the bottom thereof did not progress, and after dipping for 60 minutes, finally these layers could be stripped off in a degree of 60 to 90%. In addition, a composition having the same composition ratio as in Example 1 except that ascorbyl palmitate instead of hydroxylamine or/and a derivative thereof was used as a reducing agent (Comparative Example 3) was prepared, but composition ratio could not be altered widely because ascorbyl palmitate deposited as a solid. It was also found that when evaluation was carried out using a composition having a similar composition ratio (Comparative Example 2), stripping of these layers in a degree of 90% or more required dipping for 5 minutes or more. On the other hand, these layers could be well stripped off by dipping for only 3 minutes in Example 19. From these facts, it was found that stripping of these layers in a very short time efficiently was due to selection of hydroxylamine or/and a derivative thereof as a reducing agent.

From the results mentioned above, by treating the surface of a semiconductor substrate having an anti-reflection coating layer and a resist layer with the semiconductor surface treating agent composition of the present invention, not only stripping of these layers in a short time and efficiently can be expected, but also even when the semiconductor substrate is one where a copper wiring such as, for example, a multilayer wiring structure and the like is provided as a metal wiring, stripping of the above-described layers efficiently without giving an adverse effect to the copper wiring can be expected. In addition, since the semiconductor surface treating agent composition of the present invention enables stripping of the above-described layers in shorter time under an acidic condition, even when bottom layer of the treatment layer is an insulation film such as a Low-k film or the like which is susceptible to an alkali, stripping of the above-described layers efficiently without giving an adverse effect to the insulation film can be expected.

INDUSTRIAL APPLICABILITY

The semiconductor surface treating agent composition of the present invention enables to strip off not only an anti-reflection coating layer in the production process of semiconductor device and the like, but also both layers including a resist layer coated on the upper part thereof in a short time and efficiently, and further to strip off a cured resist layer which is formed in an etching process. In addition, since the semiconductor surface treating agent composition of the present invention does not give an adverse effect to a copper wiring on the surface of a semiconductor substrate and an insulation film such as a Low-k film under the treatment layer, the composition can be suitably used for a semiconductor substrate having these constitutions.

In addition, since the method for treating semiconductor surface of the present invention is one which is capable of stripping not only an anti-reflection coating layer but also a resist layer and a cured resist layer simultaneously easily and in a short time, stripping of these treatment layers becomes possible without carrying out a cumbersome treatment such as ashing process which had been carried out previously.

What is claimed is:

1. A semiconductor surface treating agent; composition, comprising:
   [I] a compound generating a fluorine ion in water,
   [II] a carbon radical generating agent; ,
   [III] water, [IV] an organic solvent, and
   [V] at least one kind of compound selected from a group consisting of hydroxylamine and a hydroxylamine derivative represented by the general formula [1]:

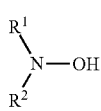

[1]

wherein $R^1$ represents a linear, branched or cyclic C1-6 alkyl group, or a linear or branched C1-4 substituted alkyl group having 1 to 3 hydroxyl groups; $R^2$ represents a hydrogen atom, a linear, branched or cyclic C1-6 alkyl group, or a linear or branched C1-4 substituted alkyl group having 1 to 3 hydroxyl groups, and wherein the [II] carbon radical generating agent; is selected from the group consisting of an azonitrile type carbon radical generating agent; an azoamide type carbon radical generating agent; a chain-like azoamidine type carbon radical generating agent; which is selected from the group consisting of 2,2'-azobis(2-methylpropionamidine) dihydrochloride and 2,2'-azobis[N-(2-carboxyethyl)-2-methylpropionamidine]tetrahydrate; a cyclic azoamidine type carbon radical generating agent; an azoester type carbon radical generating agent; an azonitrile carboxylic acid type carbon radical generating agent; an azoalkyl type carbon radical generating agent; a macroazo type carbon radical generating agent; a benzoin alkyl ether type carbon radical generating agent; a benzylketal type carbon radical generating agent; a benzophenone type carbon radical generating agent; an aminobenzoate ester type carbon radical generating agent; a 1,2-hydroxyalkylphenone type carbon radical generating agent; an 1,2-aminoalkylphenone type carbon radical generating agent; an acylphosphin oxide type carbon radical generating agent; an anthraquinone type carbon radical generating agent; a thioxanthone type carbon radical generating agent; an acridone type carbon radical generating agent; an imidazole type carbon radical generating agent; an oxime ester type carbon radical generating agent; and a titanocene type carbon radical generating agent.

2. The composition according to claim 1, wherein the semiconductor surface treating agent; composition further comprises [VI] an acid.

3. The composition according to claim 1, wherein the semiconductor surface treating agent; composition further comprises [VII] a surfactant.

4. The composition according to claim 1, wherein the [I] compound generating a fluorine ion in water is a salt of hydrogen fluoride and an inorganic non-metal base.

5. The composition according to claim 4, wherein the salt of hydrogen fluoride and an inorganic non-metal base is ammonium fluoride.

6. The composition according to claim 1, wherein the [II] carbon radical generating agent; is a compound which generates a carbon radical by irradiation of light having a wavelength of 200 to 750 nm.

7. The composition according to claim 1, wherein the [IV] organic solvent is at least one kind of compound selected from a group consisting of alcohol type, ester type, amide type and sulfoxide type organic solvents, dipole moment of each selected organic solvent itself is 1.5 to 7.5 debye, and specific gravity of each selected organic solvent itself is in a range of 0.7 to 1.2.

8. The composition according to claim 1, wherein the [IV] organic solvent is at least one kind of compound selected from a group consisting of isopropanol, γ-butyrolactone and N-methylpyrolidone.

9. The composition according to claim 1, wherein the [V] at least one kind of compound selected from a group consisting of hydroxylamine and a hydroxylamine derivative represented by the general formula [1] is at least one kind of compound selected from a group consisting of mono- or diethylhydroxylamine, mono- or bis(2,2-dihydroxyethyl)hydroxylamine and mono- or bis(2,3-dihydroxy-n-propyl)-1-hydroxylamine.

10. The composition according to claim 1, wherein the [V] at least one kind of compound selected from a group consisting of hydroxylamine and a hydroxylamine derivative represented by the general formula [1] is at least one kind of compound selected from a group consisting of diethylhydroxylamine, bis(2,2-dihydroxyethyl)hydroxylamine and bis(2,3-dihydroxy-n-propyl)-1-hydroxylamine.

11. The composition according to claim 2, wherein the [VI] acid is at least one kind of compound selected from a group consisting of an aliphatic dicarboxylic acid or a salt thereof, an aliphatic hydroxycarboxylic acid or a salt thereof, an aromatic dicarboxylic acid or a salt thereof and an aromatic hydroxycarboxylic acid or a salt thereof.

12. The composition according to claim 11, wherein the at least one kind of compound selected from a group consisting of an aliphatic dicarboxylic acid or a salt thereof, an aliphatic hydroxycarboxylic acid or a salt thereof, an aromatic dicarboxylic acid or a salt thereof and an aromatic hydroxycarboxylic acid or a salt thereof is at least one kind of acid selected from a group consisting of oxalic acid, monosodium oxalate, monopotassium oxalate, monoammonium oxalate, malonic acid, monosodium malonate, monopotassium malonate, monoammonium malonate, succinic acid, monosodium succinate, monopotassium succinate, monoammonium succinate, glutaric acid, monosodium glutarate, monopotassium glutarate, monoammonium glutarate, adipic acid, monosodium adipate, monopotassium adipate, monoammonium adipate, pimelic acid, monosodium pimelate, monopotassium pimelate, monoammonium pimelate, maleic acid, monosodium maleate, monopotassium maleate, monoammonium maleate, fumaric acid, monosodium fumarate, monopotassium fumarate, monoammonium fumarate, malic acid, monosodium malate, monopotassium malate, monoammonium malate, tartaric acid, monosodium tartrate, monopotassium tartrate, monoammonium tartrate, citric acid, monosodium citrate, disodium citrate, monopotassium citrate, dipotassium citrate, monoammonium citrate, diammonium citrate, phthalic acid, monosodium phthalate, monopotassium phthalate, and monoammonium phthalate.

13. The composition according to claim 11, wherein the at least one kind of compound selected from a group consisting of an aliphatic dicarboxylic acid or a salt thereof, an aliphatic hydroxycarboxylic acid or a salt thereof, an aromatic dicarboxylic acid or a salt thereof and an aromatic hydroxycarboxylic acid or a salt thereof is at least one kind of compound selected from a group consisting of oxalic acid, monosodium oxalate, monopotassium oxalate, monoammonium oxalate, malonic acid, monosodium malonate, monopotassium malonate, monoammonium malonate, tartaric acid, monosodium tartrate, monopotassium tartrate, monoammonium tartrate, citric acid, monosodium citrate, disodium citrate, monopotassium citrate, dipotassium citrate, monoammonium citrate, and diammonium citrate.

14. The composition according to claim 1, wherein a pH of the semiconductor surface treating agent composition is 7 or less.

15. The composition according to claim 2, wherein a pH of the semiconductor surface treating agent composition is in a range of 1 to 4.

16. A method for treating a semiconductor surface, comprising applying the semiconductor surface treating agent composition according to claim 1 to a semiconductor substrate.

17. The method for treating a semiconductor surface according to claim 16, further comprising stripping an antireflection coating layer with the semiconductor surface treating agent composition.

18. The method for treating a semiconductor surface according to claim 16, further comprising stripping a BARC layer with the semiconductor surface treating agent composition.

19. The method for treating a semiconductor surface according to claim 16, further comprising stripping an antireflection coating layer and a resist layer with the semiconductor surface treating agent composition.

20. The method for treating a semiconductor surface according to claim 16, further comprising stripping a BARC layer and a resist layer with the semiconductor surface treating agent composition.

21. The method for treating a semiconductor surface according to claim 17, wherein a lower layer of the antireflection coating layer is a Low-k film.

22. The method for treating a semiconductor surface according to claim 19, wherein a lower layer of the antireflection coating layer is a Low-k film.

23. The method for treating a semiconductor surface according to claim 16, wherein the semiconductor substrate has a multilayer copper wiring structure.

24. The composition according to claim 2, wherein the semiconductor surface treating agent composition further comprises [VII] a surfactant.

25. The composition according to claim 1, wherein the [II] carbon radical generating agent is selected from the group consisting of an azonitrile type carbon radical generating agent; an azoamide type carbon radical generating agent; a chain-like azoamidine type carbon radical generating agent; which is selected from the group consisting of 2,2'-azobis(2-methylpropionamidine) dihydrochloride and 2,2'-azobis[N-(2-carboxyethyl)-2-methylpropionamidine] tetrahydrate; a cyclic azoamidine type carbon radical generating agent; an azoester type carbon radical generating agent; a benzoin alkyl ether type carbon radical generating agent; a benzylketal type carbon radical generating agent; a benzophenone type carbon radical generating agent; an aminobenzoate ester type carbon radical generating agent; a 1,2-hydroxyalkylphenone type carbon radical generating agent; an 1,2-aminoalkylphenone type carbon radical generating agent; an acylphosphin oxide type carbon radical generating agent; an anthraquinone type carbon radical generating agent; a thioxanthone type carbon radical generating agent; an acridone type carbon radical generating agent; an imidazole type carbon radical generating agent; an oxime ester type carbon radical generating agent; and a titanocene type carbon radical generating agents.

26. The composition according to claim 1, wherein the [II] carbon radical generating agent; is selected from the group consisting of an azonitrile type carbon radical generating agent; an azoamide type carbon radical generating agent; a chain-like azoamidine type carbon radical generating agent which is selected from the group consisting of 2,2'-azobis(2-methylpropionamidine) dihydrochloride and 2,2'-azobis[N-(2-carboxyethyl)-2-methylpropionamidine] tetrahydrate; an azoester type carbon radical generating agent; a benzylketal type carbon radical generating agent; a 1,2-hydroxyalkylphenone type carbon radical generating agent; and an 1,2-aminoalkylphenone type carbon radical generating agent.

27. The composition according to claim 17, wherein a content of the [I] compound generating a fluorine ion in water is 0.01 to 5% by weight, a content of the [II] carbon radical generating agent; is 0.05 to 10% by weight, a content of the [III] water is 0.02 to 10% by weight, a content of the [IV] organic solvent is 80 to 99% by weight, a content of the [V] at least one kind of compound selected from a group consisting of hydroxylamine and a hydroxylamine derivative represented by the general formula [1] is 0.001 to 5% by weight, a content of the [VI] acid is 0.1 to 5% by weight, and a content of the [VII] surfactant is 0.05 to 5% by weight.

* * * * *